US009646962B1

(12) United States Patent
Liu et al.

(10) Patent No.: US 9,646,962 B1
(45) Date of Patent: May 9, 2017

(54) LOW LEAKAGE GATE CONTROLLED VERTICAL ELECTROSTATIC DISCHARGE PROTECTION DEVICE INTEGRATION WITH A PLANAR FINFET

(71) Applicants: International Business Machines Corporation, Armonk, NY (US); GLOBALFOUNDRIES INC., Grand Cayman (KY); STMICROELECTRONICS, INC., Coppell, TX (US)

(72) Inventors: Qing Liu, Irvine, CA (US); Ruilong Xie, Schenectady, NY (US); Chun-chen Yeh, Clifton Park, NY (US)

(73) Assignees: INTERNATIONAL BUSINESS MACHINES CORPORATION, Armonk, NY (US); STMICROELECTRONICS, INC., Coppell, TX (US); GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/285,985

(22) Filed: Oct. 5, 2016

(51) Int. Cl.
*H01L 27/02* (2006.01)
*H01L 27/092* (2006.01)
(Continued)

(52) U.S. Cl.
CPC .. *H01L 27/0255* (2013.01); *H01L 21/823821* (2013.01); *H01L 21/823828* (2013.01);
(Continued)

(58) Field of Classification Search
CPC ......... H01L 27/0255; H01L 21/823821; H01L 21/823828; H01L 21/823871;
(Continued)

(56) References Cited

U.S. PATENT DOCUMENTS 7,368,354 B2   5/2008   Anderson et al.
7,700,449 B2   4/2010   Lee
(Continued)

OTHER PUBLICATIONS

D. Linten et al., "ESD in FinFET technologies: Past learning and emerging challenges." International Reliability Physics Symposium, 2013, 2B-5, 8 pages.
(Continued)

*Primary Examiner* — Scott B Geyer
(74) *Attorney, Agent, or Firm* — Cantor Colburn LLP; Vazken Alexanian

(57) ABSTRACT

A semiconductor device includes an electrostatic discharge (ESD) device formed adjacent to a first fin field effect transistor (finFET). The device includes a substrate, the first finFET and the ESD device. The first finFET is formed such that it includes finFET fins extending from the substrate. The ESD device includes two vertically stacked PN diodes including vertically stacked first, second, third and fourth layers. The first layer is an N doped layer and is disposed directly over the substrate, the second layer is a P doped layer and is disposed directly over the first layer, the third layer is an N doped layer and is disposed directly over the second layer and the fourth layer is a P doped layer and is disposed directly over the third layer.

25 Claims, 20 Drawing Sheets

(51) Int. Cl.
*H01L 29/861* (2006.01)
*H01L 29/66* (2006.01)
*H01L 21/8238* (2006.01)
*H01L 29/06* (2006.01)
*H01L 29/10* (2006.01)

(52) U.S. Cl.
CPC ............... *H01L 21/823871* (2013.01); *H01L 21/823878* (2013.01); *H01L 27/0924* (2013.01); *H01L 29/0649* (2013.01); *H01L 29/1083* (2013.01); *H01L 29/66136* (2013.01); *H01L 29/8613* (2013.01)

(58) Field of Classification Search
CPC ......... H01L 21/823878; H01L 27/0924; H01L 29/0649; H01L 29/1083; H01L 29/66136; H01L 29/8613
See application file for complete search history.

(56) References Cited

U.S. PATENT DOCUMENTS

| | | |
|---|---|---|
| 8,759,194 B2 | 6/2014 | Gauthier, Jr. et al. |
| 8,779,517 B2 | 7/2014 | Lin et al. |
| 8,916,426 B2 | 12/2014 | Clark, Jr. et al. |
| 9,177,951 B2 | 11/2015 | Singh et al. |
| 9,209,172 B2 * | 12/2015 | Cheng ................... H01L 21/762 |
| 9,209,202 B2 * | 12/2015 | Ponoth .............. H01L 21/76224 |

OTHER PUBLICATIONS

J-H. Lee et al., "Methodology to achieve planar technology-like ESD performance in FINFET process," International Reliability Physics Symposium, 2015, 3F-3, 6 pages.

S. Cao, "ESD Protection for Advanced SOI," Advanced Substrate News, No. 17, May 4, 2011. Download from the Internet Aug. 8, 2016, www.advancedsubstratenews.com/2011/05/esd-protection-for-advanced-soi/.

S. Kolluri et al., "Modeling and analysis of self-heating in FinFET devices for improved circuit and EOS/ESD performance," International Electron Devices Meeting, 2007, pp. 177-180.

S. Thijs et al., "Advanced ESD power clamp design for SOI FinFET CMOS technology," International Conference on Integrated Circuit Design and Technology, 2010, pp. 43-46.

* cited by examiner

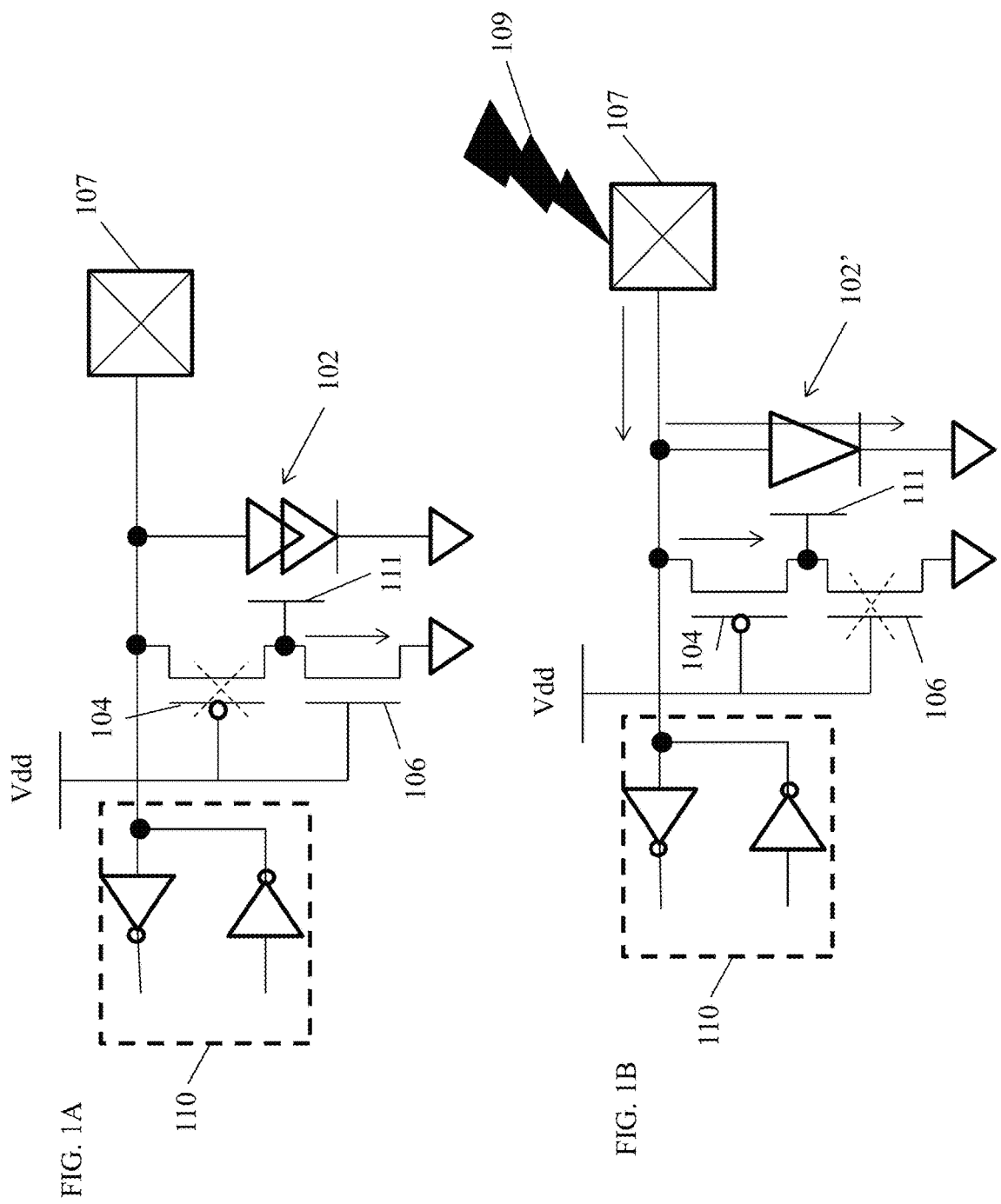

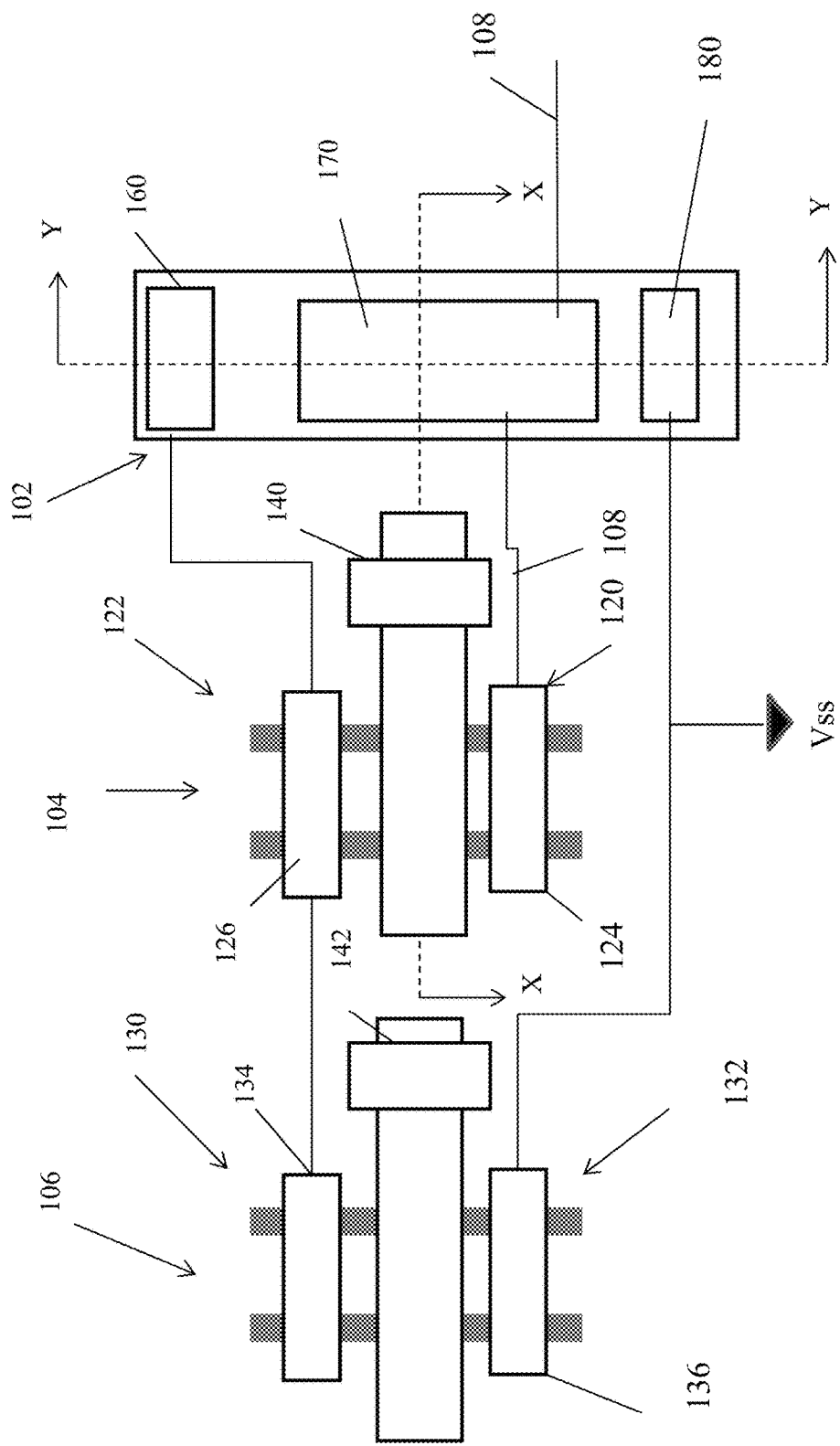

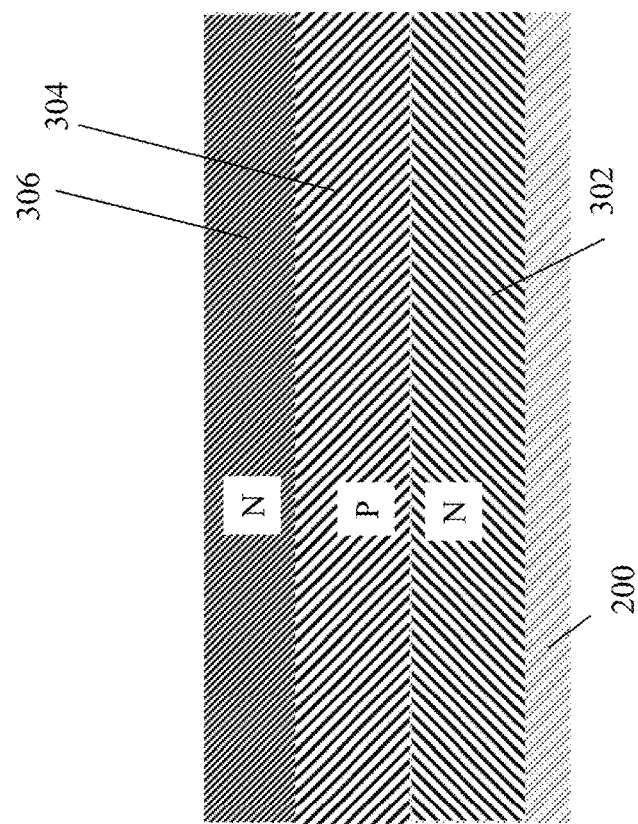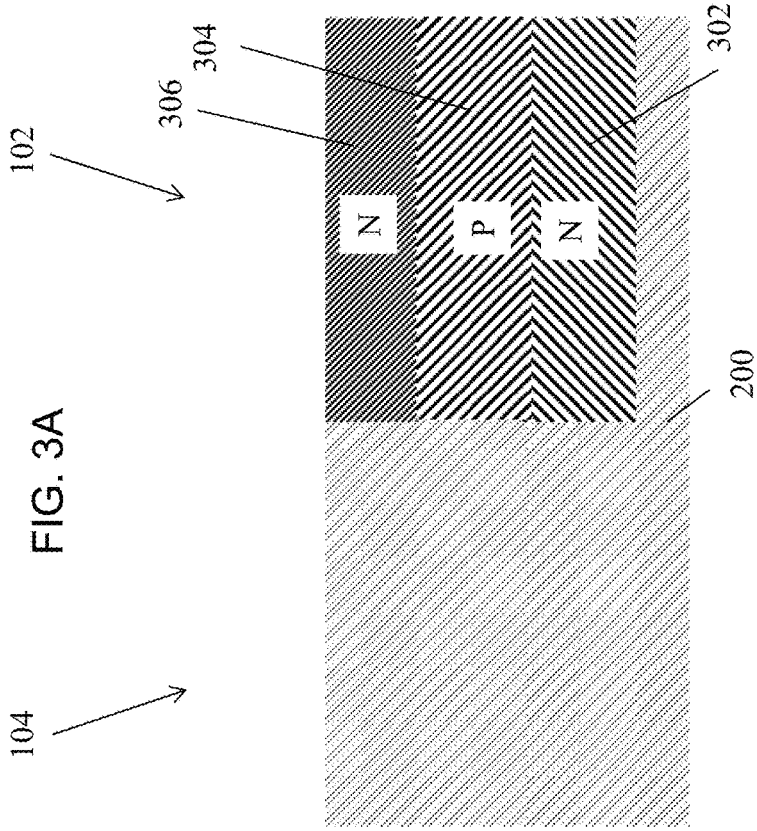

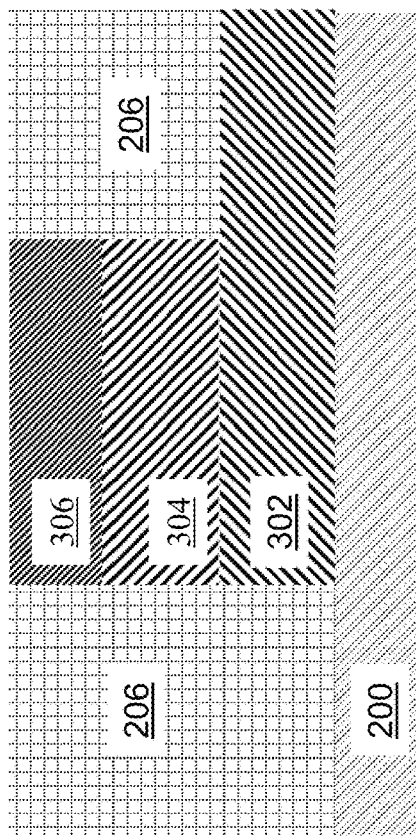
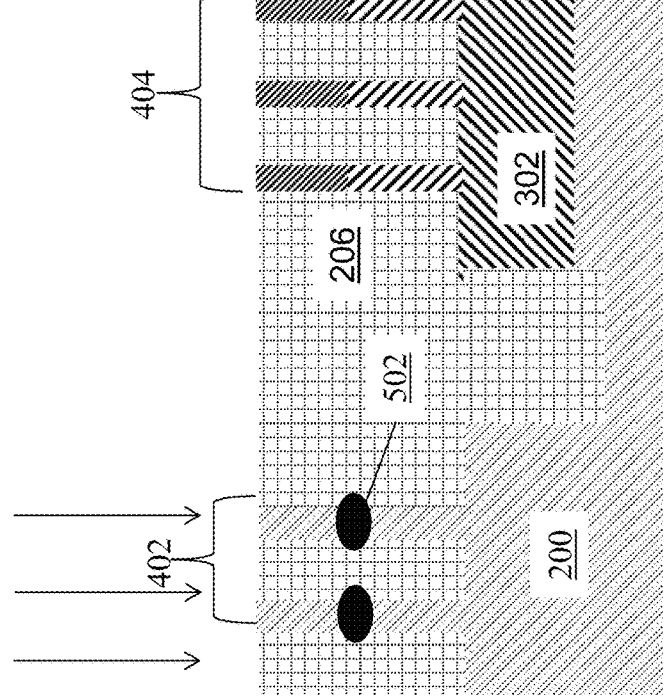
FIG. 5B
FIG. 5A

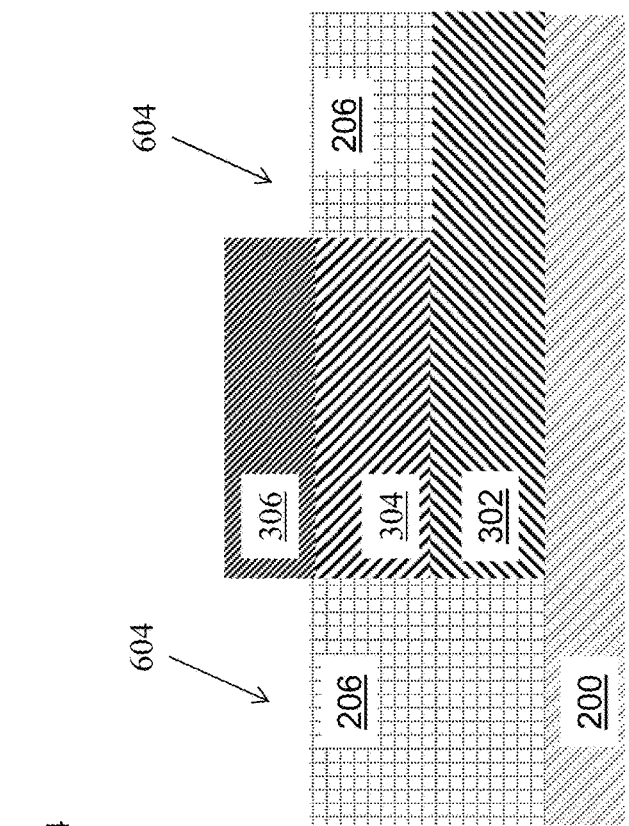
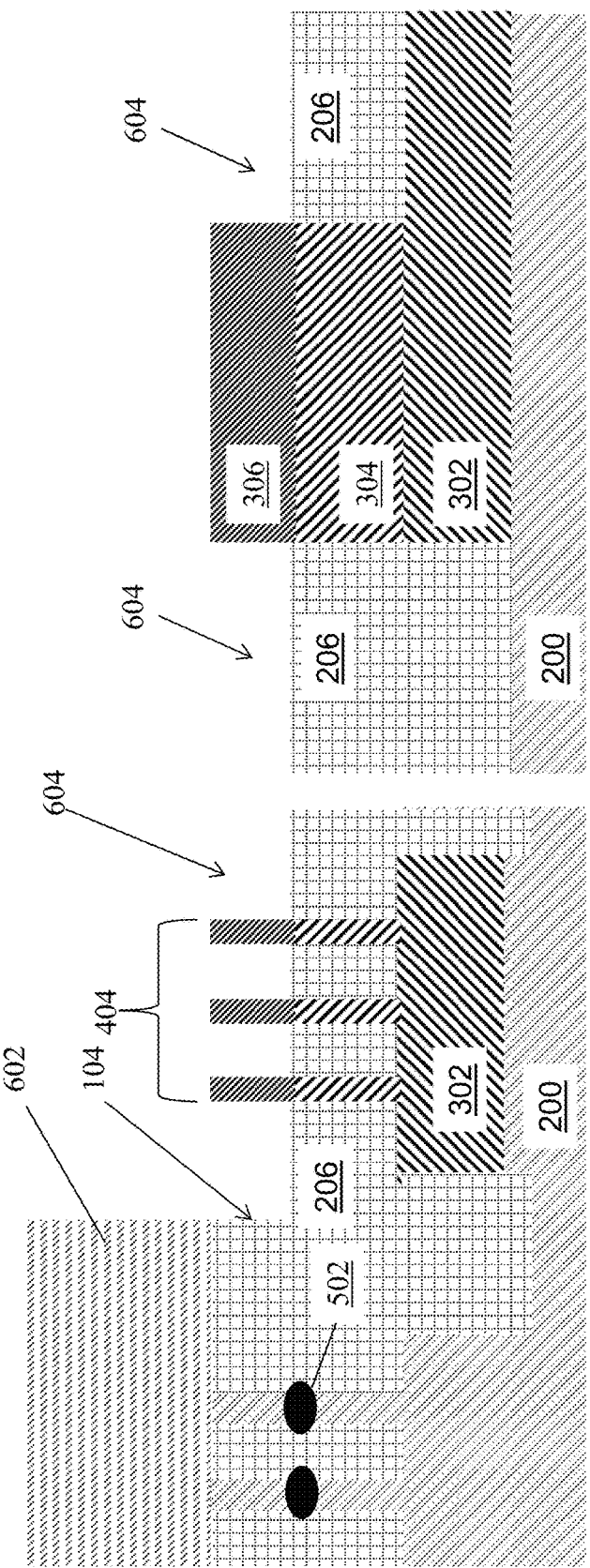
FIG. 6B
FIG. 6A

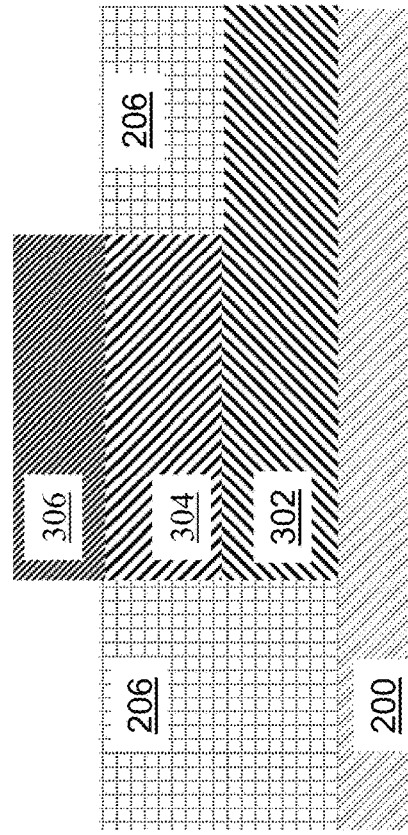
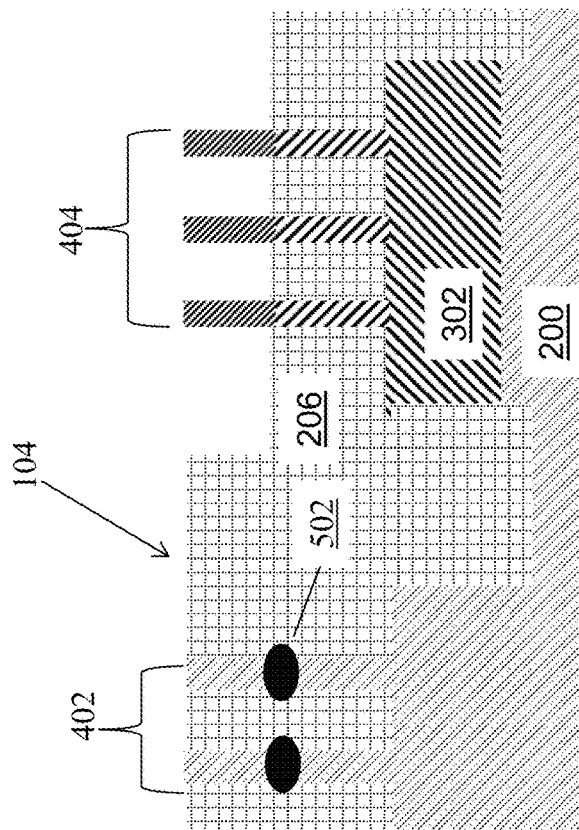
FIG. 7A
FIG. 7B

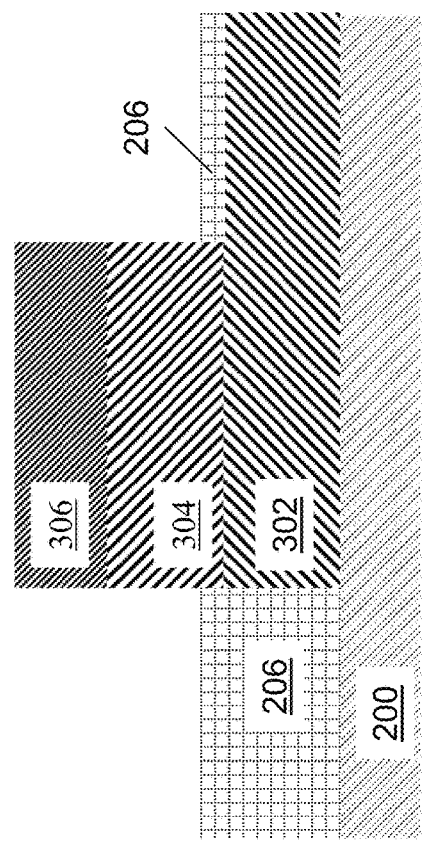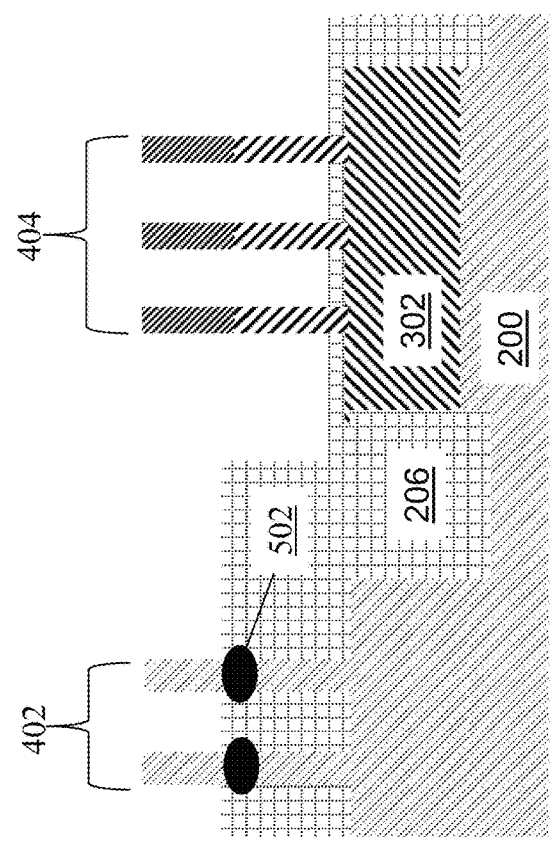
FIG. 8B
FIG. 8A

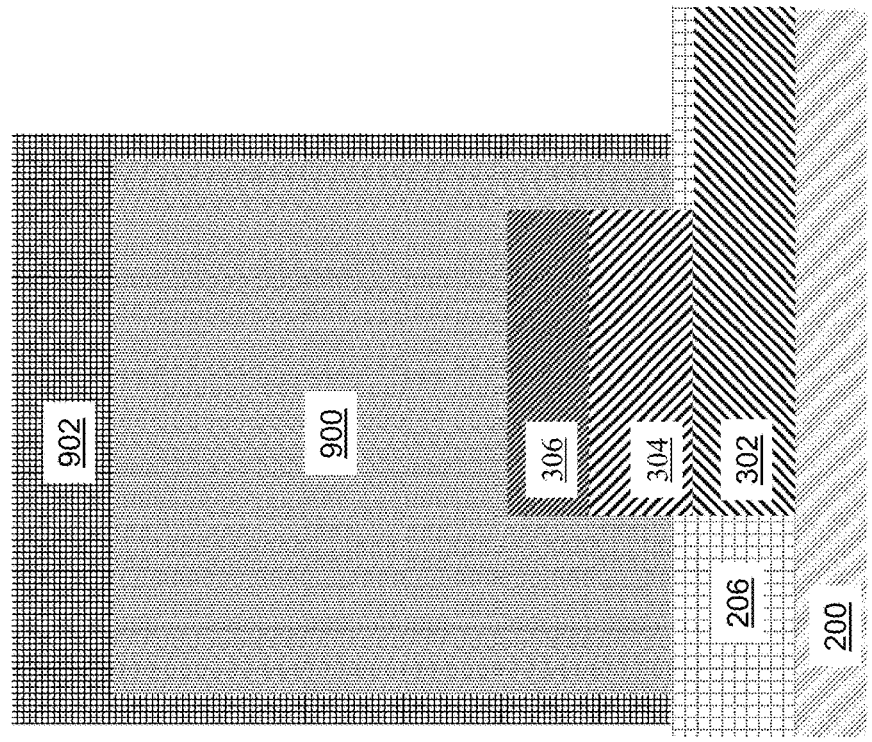
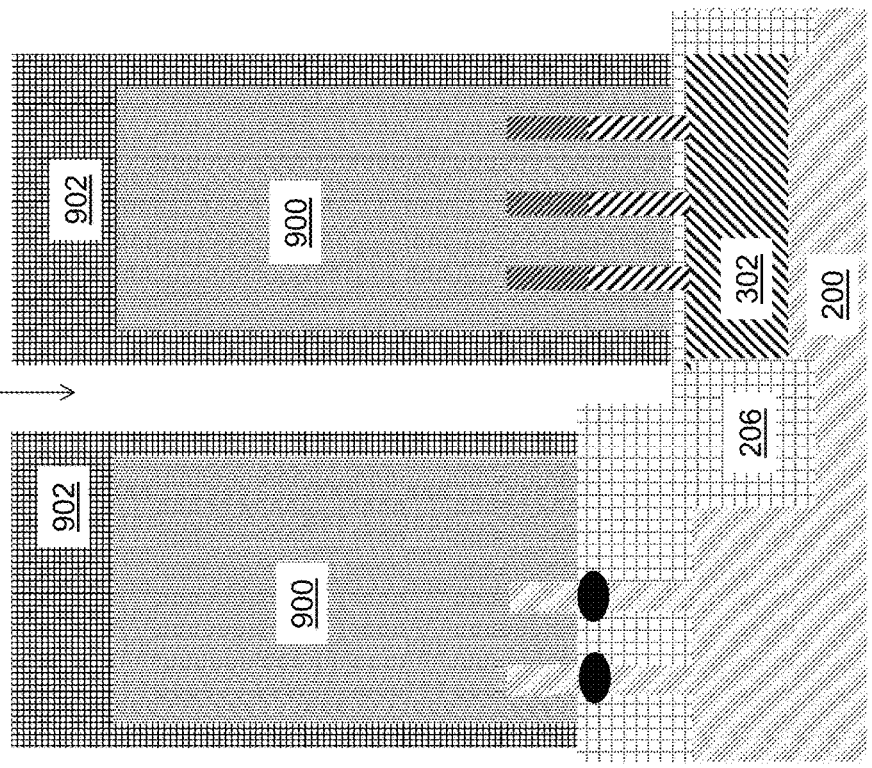

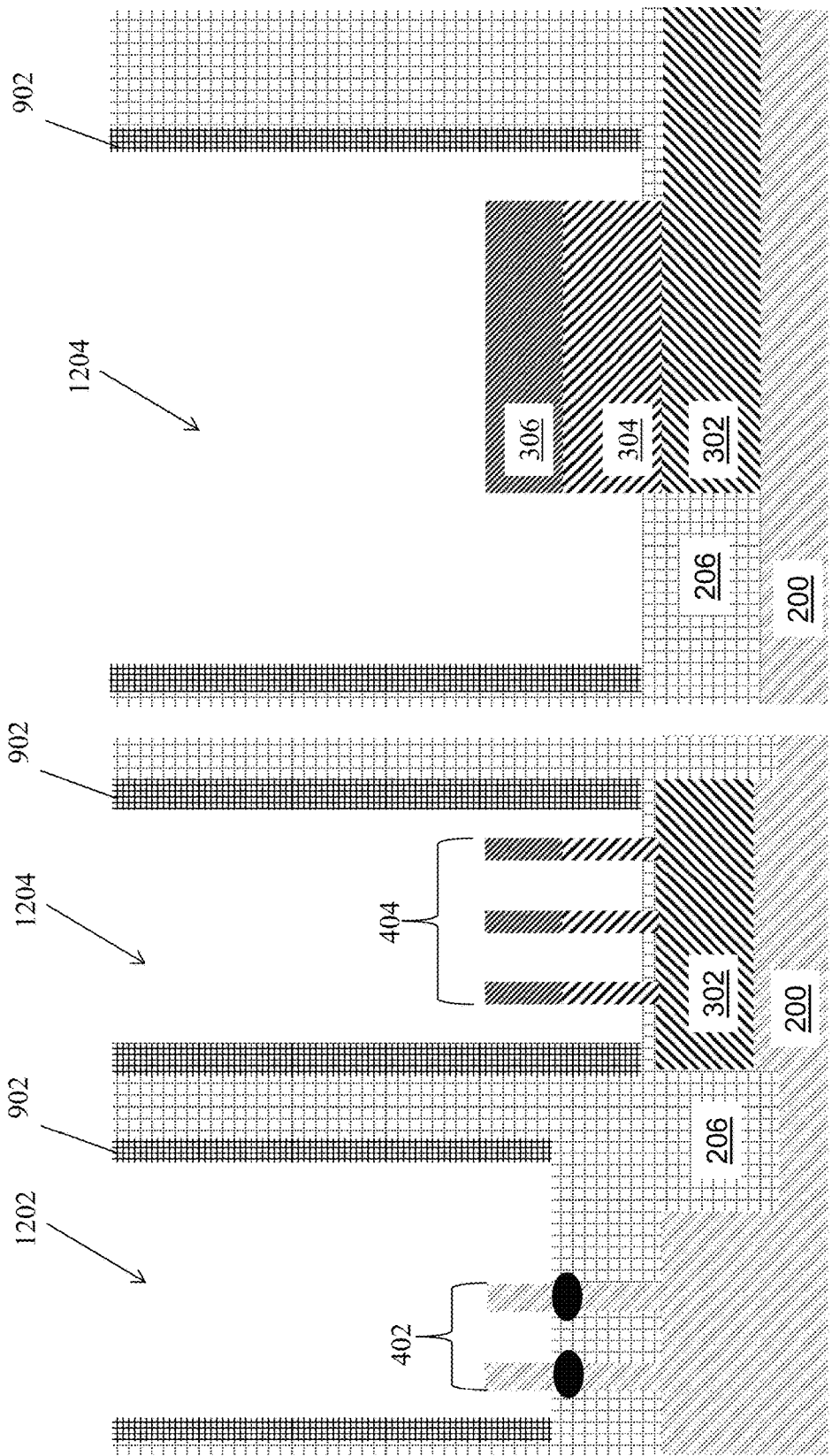

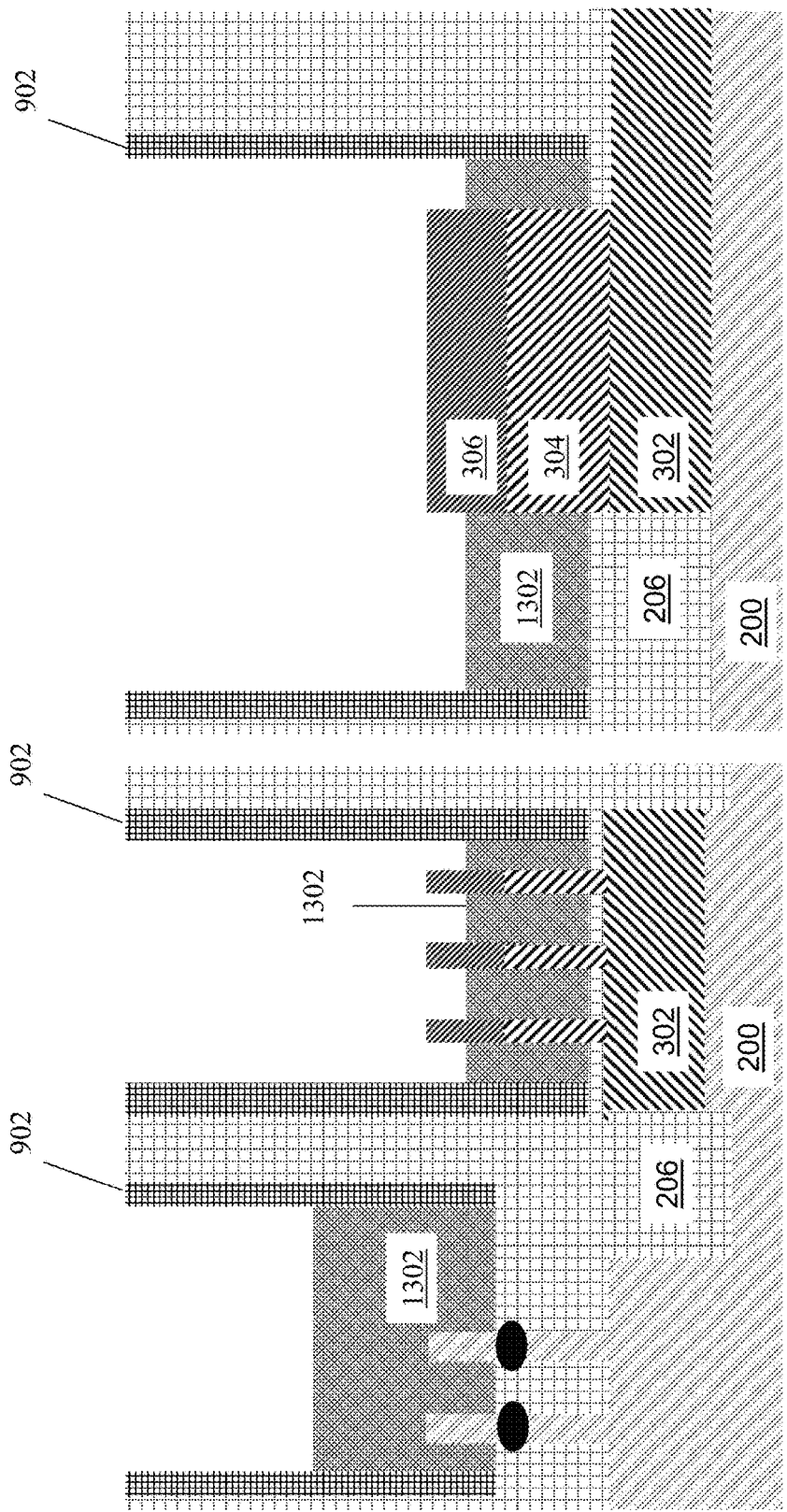

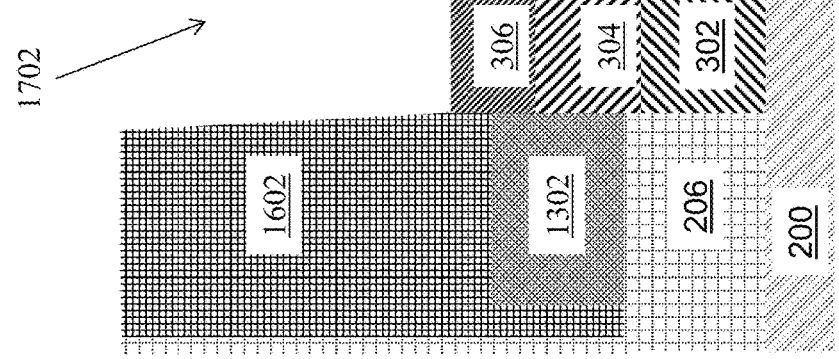
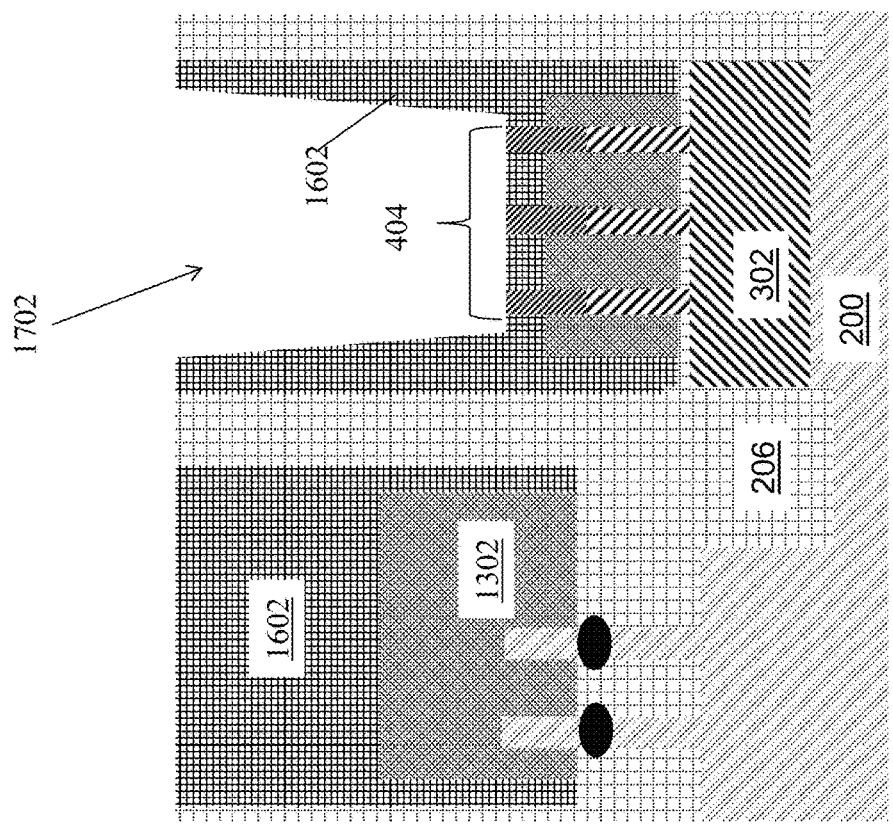
FIG. 17B
FIG. 17A

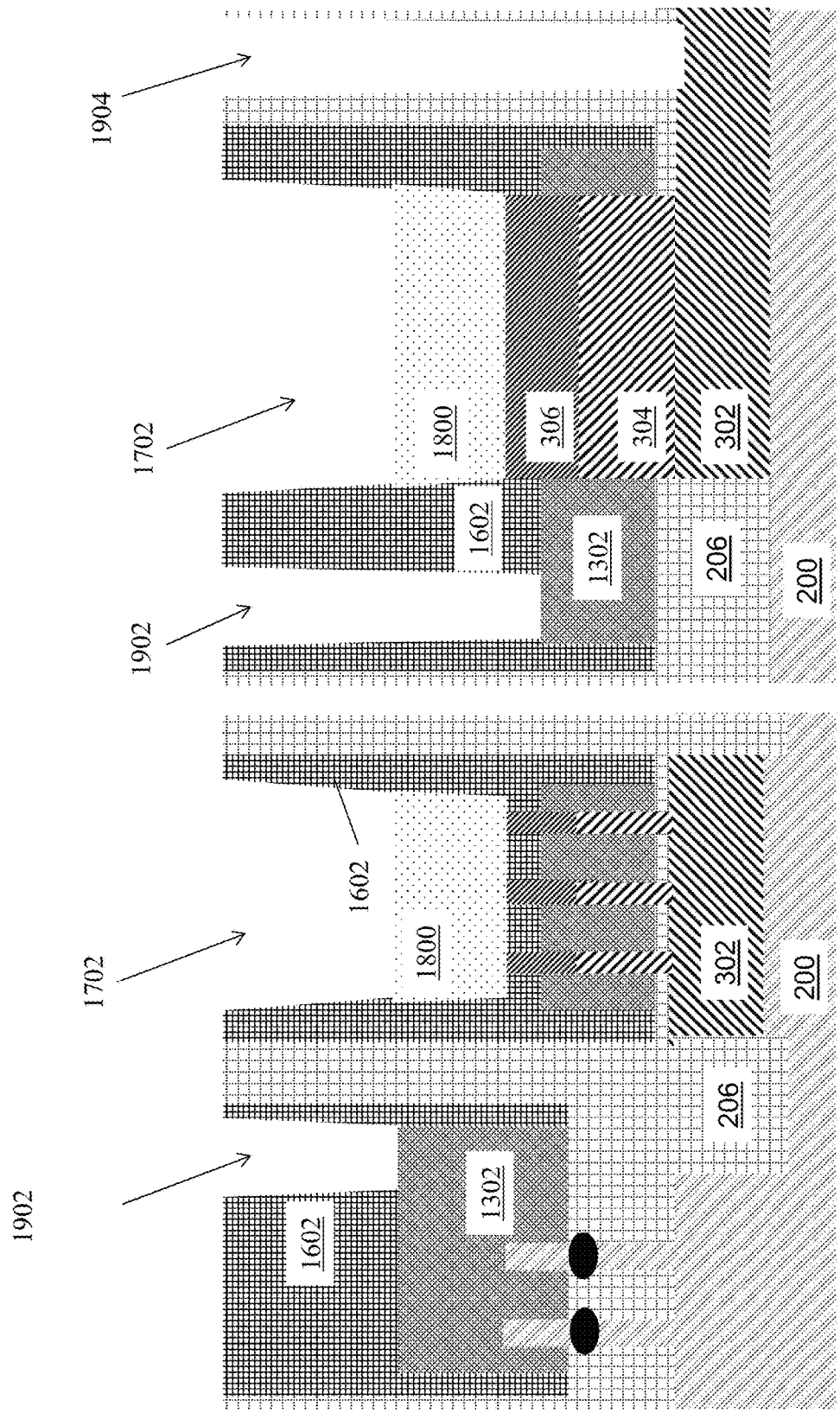

LOW LEAKAGE GATE CONTROLLED VERTICAL ELECTROSTATIC DISCHARGE PROTECTION DEVICE INTEGRATION WITH A PLANAR FINFET

BACKGROUND

The present invention relates in general to semiconductor device fabrication methods and resulting structures. More specifically, the present invention relates to fabrication methods and resulting structures created from a process that integrates the formation of a vertical electrostatic discharge protection device with that of a planar fin field effect transistors (finFET).

In contemporary semiconductor device fabrication processes, a large number of semiconductor devices, such as fin field effect transistors (finFETs), are fabricated in and on a single wafer. FinFETs employ semiconductor fins to introduce on-wafer topography. The semiconductor fins are often formed as an array of semiconductor fins having a periodicity, or fin pitch, to minimize etch bias due to pattern factor, i.e., the fraction of the area of the semiconductor fins within a unit area. An example of the finFET is a planar finFET. Such a device can include a gate region formed over fins. A source and drain is formed by connecting to the fins on opposing sides of the gate.

Technology scaling unfavorably affects the electrostatic discharge (ESD) protection of integrated circuits by reducing FET oxide and junction breakdown voltage, and diode current shunting capability as well as by increasing the interconnect resistivity. Further, the I/O data-rate increasingly limits the capacitive budget, exacerbating the shrinkage of ESD design space. As such, it is important to find ESD solutions that minimize parasitic loading while achieving superior robustness.

SUMMARY

According to one or more embodiments of the present invention, a semiconductor device including an electrostatic discharge (ESD) device formed adjacent to a first fin field effect transistor (finFET) is described. The device includes a substrate, the first finFET and the ESD device. The first finFET is formed such that it includes finFET fins extending from the substrate. The ESD device includes two vertically stacked PN diodes including vertically stacked first, second, third and fourth layers. The first layer is an N doped layer and is disposed directly over the substrate, the second layer is a P doped layer and is disposed directly over the first layer, the third layer is an N doped layer and is disposed directly over the second layer and the fourth layer is a P doped layer and is disposed directly over the third layer.

According to one or more embodiments of the present invention a semiconductor device formed on a substrate is described. The device includes a p-channel fin field effect transistor (p-finFET) having a p-finFET drain and a p-finFET source and formed on a substrate and an n-channel fin field effect transistor (n-finFET) adjacent the p-finFET and having a n-finFET drain and a p-finFET source. The p-finFET source is connected to an input line, the p-finFET drain is connected to the n-finFET drain. The device further includes an electrostatic discharge (ESD) device, the ESD device is disposed adjacent the p-finFET and including two vertically stacked PN diodes. The diodes including vertically stacked first, second, third and fourth layers, wherein the first layer is an N doped layer and is disposed directly over the substrate, the second layer is a P doped layer and is disposed directly over the first layer, the third layer is an N doped layer and is disposed directly over the second layer and the fourth layer is a P doped layer and is disposed directly over the third layer.

According to one or more embodiments of the present invention a method for forming a semiconductor device including a fin field effect (finFET) transistor is described. The method includes: receiving a substrate; doping an electrostatic discharge (ESD) device portion of the substrate to include a first layer directly on the substrate and that is n-doped, a second layer directly on the first layer and that is p-doped and a third layer directly on the second layer that is n-doped; forming a plurality of fins including a p-finFET group of fins formed from the substrate and an ESD group of fins formed to include the portions of the second and third layers; filling space between the fins with a shallow trench isolator (STI); removing a portion of the STI to expose the p-finFET group and the second and third layers of the ESD device group; depositing a metal gate stack material over the p-finFET group and ESD group; exposing portions for fins in the ESD group above a top of the metal gate stack material; forming a nitride cap of the ESD group and over metal gate stack material that is over the pfinFET group; forming a fourth layer over the third layer; and forming an ESD gate contact, a p-finFET gate contact and a ground contact in the nitride cap.

According to one or more embodiments of the present invention, a method for forming a semiconductor device including a fin field effect (finFET) transistor and a protection device is described. The method includes receiving a substrate; doping an electrostatic discharge (ESD) device portion of the substrate to include a first layer directly on the substrate and that is n-doped, a second layer directly on the first layer and that is p-doped and a third layer directly on the second layer that is n-doped; forming a plurality of fins including a p-finFET group of fins formed from the substrate and an ESD group of fins formed to include the portions of the second and third layers; filling space between the fins with a shallow trench isolator (STI); removing a portion of the STI to expose the p-finFET group and the second and third layers of the ESD device group; depositing a metal gate stack material over the p-finFET group and ESD group; exposing portions for fins in the ESD group above a top of the metal gate stack material; forming a nitride cap of the ESD group and over metal gate stack material that is over the pfinFET group; forming a fourth layer over the third layer; forming an ESD gate contact, a p-finFET gate contact and a ground contact in the nitride cap; forming a drain contact that contacts fins in the p-finFET group on one side of the metal gate stack material; and connecting the drain contact to the ESD gate contact.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

FIG. 1A depicts a circuit diagram of an inverter protected by an electrostatic discharge (ESD) device in a normal operating mode;

FIG. 1B depict a circuit diagram of an inverter protected by an electrostatic discharge (ESD) device in a protective mode;

FIG. 2 is a simplified top view of a semiconductor layout of the circuit shown in FIGS. 1A and 1B;

FIGS. 3A and 3B show, respectively, cross-sections taken along lines X-X and Y-Y of FIG. 2;

FIGS. 5A and 5B show the structure of FIGS. 4A and 4B after one or more fins in the p-finFET group of fins have been doped to form a punch through prevention implant therein;

FIGS. 6A and 6B show the structure of FIGS. 5A and 5B after an oxide recess has been formed to reveal fins that will be part of an ESD device;

FIGS. 7A and 7B show the structure of FIGS. 6A and 6B a protective layer over there finFET has been removed;

FIGS. 8A and 8B show the structure of FIGS. 7A and 7B after more of the STI material has been removed to further reveal fins that will be part of an ESD device and to reveal fins that will form the finFET;

FIGS. 10A and 10B show the structure of FIGS. 9A and 9B after the dummy gate material has been subjected to a reactive ion etch (RIE) that has removed the dummy gate material between the finFET and the EDS device and spacers have been formed over the remaining dummy gate material;

FIGS. 12A and 12B show the structure of FIGS. 11A and 11B after removal of the dummy gate material;

FIGS. 15A and 15B show the structure of FIGS. 14A and 14B after the metal gate stack material deposited over the fins of the finFET has been exposed;

FIGS. 17A and 17B show the structure of FIGS. 16A and 16B after an opening has been formed over the ESD to allow for the deposition of the top P layer (fourth layer) onto the ESD device;

FIGS. 19A and 19B show the structure of FIGS. 18A and 18B after a gate contact well has been formed over the finFET and a gate contact well has been formed on a side of the ESD device.

DETAILED DESCRIPTION

Figures 4A, 4B:
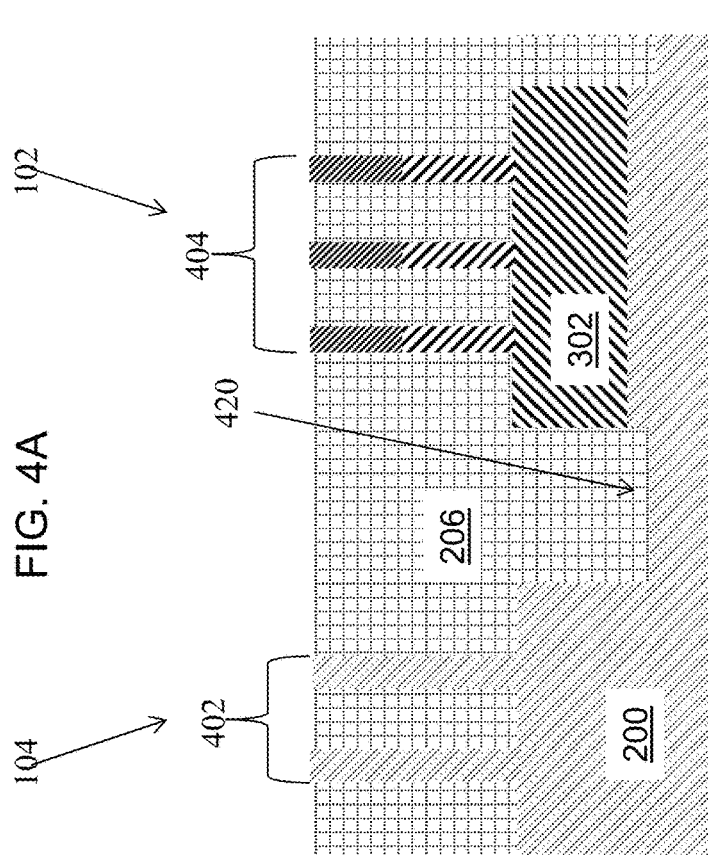
FIGS. 4A and 4B show the structure of FIGS. 3A and 3B after fins have been formed in the structure of FIGS. 3A and 3B.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The terms "direct contact" or "directly contacting" mean that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device having a dummy fin removed from within an array of tight pitch fins according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description, embodiments described herein allow the fabrication of finFET semiconductor structures that have electrostatic discharge (ESD) protection devices formed in the same process flow. An example of such an ESD device is a so called double well field effect diode (DWFED). Herein a method of forming such a device and the resulting structure is described and the process is performed in a same process flow as that used to form one or more finFETs that the ESD is protecting. The DWFED (also referred to an "ESD protection device" or "ESD device" herein) has back-to-back PN diodes (resulting in a vertical PNPN structure) where the P-type junction in the middle is controlled by a gate contact to turn on/off during normal operation or ESD events. As a result the turn on voltage is increases over conventional diodes to minimize the leakage current. It also has much reduced capacitance and resistance compared to the SCR. The fact that the diodes are stacked leads to the area-efficient design.

FIG. 1A depicts a circuit diagram of an inverter protected by an electrostatic discharge (ESD) device in a normal operating mode. The ESD device 102 that protects another circuit (described more fully below). The ESD device 102 will be referred to as ESD device 102 in general and as ESD device 102' when the device is operating an ESD mode (FIG. 1B).

FIG. 1B depicts a circuit diagram of an inverter protected by an electrostatic discharge (ESD) device in a protective or "ESD" operating mode. In the ESD mode (e.g. protection mode), the ESD device 102' functions as diode and clamps an ESD device to ground (or source power voltage (Vss)). Application of a sufficiently high gate voltage to a gate terminal 111 of the ESD device 102 will cause the ESD device 102 to operate in ESD mode and pass current as shown in FIG. 1B whereas it blocks current with low leakage in other instances (e.g., FIG. 1A).

In more detail, and with reference to FIG. 1A, a circuit of serially connected finFETs 104 and 106 is protected by ESD device 102. The ESD device 102 is connected to a so called ESD pad 107. Such a pad can be any location where an ESD can occur including the input to a circuit and includes, for example, a data input/output (I/O).

As illustrated, the serially connected finFETs 104 and 106 are, respectively, a pFET and an nFET. The "input" 108 to the serially connected finFETs 104, 106 is connected to the source of the pFET 104. The drain of the pFET 104 is connected to the drain of the nFET 106. The source of the nFET 106 is connected to Vss. The ESD device 102 is connected in parallel with the serially connected FETs 104, 106 between the input 108 and Vss. The gates of pFET 104 and nFET 106 are connected to Vdd that is typically in the 1V range. If the serially connected pFET 104 and nFET 106 are connected to head-to-tail connected inverters 110 (e.g., a latch) a stable inverter can be formed but embodiments described herein are not limited only to inverters.

For local clamping ESD devices such as ESD device 102, the turn on voltage is set to avoid accidental turn-on during normal operation and to minimize leakage current. Furthermore, in one or more embodiments, the ESD device 102 turns on faster than the ESD event to start shunting current (e.g., as shown in FIG. 1B) before charge accumulation raises voltage on the pad 107.

In operation, during normal operations, the inverter 110 (pFET 104 and nFET 106) pulls the gate voltage on the gate 111 to low, helping to preserve the ESD device's 102 intrinsic PNPN state. This is similar to a silicon-controlled rectifier's (SCR) OFF mode and provides for enhanced leakage protection as compared to standard diode.

With reference now to FIG. 1B, in an ESD event (e.g., pad 107 experiences an ESD event as indicated by high current discharge 109), Vdd becomes very low by comparison to the voltage on the input 108. This causes conduction through pFET 104 and blocking by nFET 106 (as indicate by the X through it). The gate 111 of the ESD device is now pulled high creating an inversion layer in the lower P-well. This inversion connects the top N layer to the bottom N layer to form a function PN diode as indicated by ESD device 102' in FIG. 1B and allows the ESD discharge 109 to pass to Vss through the ESD device 102' rather than the pFET 104 and nFET 106. In this manner, the ESD device 102' protects the pFET 104 and nFET 106 in the protection mode.

FIG. 2 shows a top view of portions of the circuit shown in FIGS. 1A and 1B as implemented as a semiconductor device. As illustrated, the circuit includes an ESD device 102 that protects two finFETS 104, 106 connected in series. Of course, both finFETs are not needed and one embodiment only includes a single finFET (e.g., finFET 104) protected by ESD device 102.

The ESD device 102 can include two vertically stacked PN junction diodes (PN diodes) including vertically stacked first, second, third and fourth layers. The first layer is the lowest layer and the fourth layer is the highest layer when measured from the bottom of the ESD device 102. That is, the fourth layer is closest to a top of the ESD device 102. In one embodiment, the first layer is an N doped layer and is disposed directly over base or substrate layer, the second layer is a P doped layer and is disposed directly over the first layer, the third layer is an N doped layer and is disposed directly over the second layer and the fourth layer is a P doped layer and is disposed directly over the third layer. Thus, the ESD device 102 as shown more fully below can include a portion where layers are stacked in a PNPN fashion to form two PN junction diodes. As discussed above, application of a sufficiently high voltage to the gate 160 of the ESD device 102 will connect the top N layer to the bottom N layer to form a function PN diode as indicated by ESD device 102'.

In more detail, the circuit of serially connected finFETs 104 and 106 is protected by the ESD device 102. The ESD device 102 is connected to a so called ESD pad 107 by a pad connection 170. As illustrated, the serially connected finFETs 104 and 106 are, respectively, a pFET and an nFET. The "input" 108 to the serially connected finFETs 104, 106 is connected to the source 120 of the pFET 104. The drain 122 of the pFET 104 is connected to the drain 130 of the nFET 106. The source 132 of the nFET 106 is connected to Vss. The source 120 and drain 122 of the pFET 104 are shown as connected to metalized contacts 124, 126, respectively. Similarly, the drain 130 and source 132 of the nFET are shown as connected to metalized contacts 134, 136, respectively. Each of the metal contacts are shown as being overlay over 2 fins but this is not meant to be limiting and each finFET can have any number of fins. The ESD device 102 is connected in parallel with the serially connected FETs 104, 106 between the input 108 and Vss. Thus, one end of the ESD device 102 (e.g., pad connection 170) is connected to the drain 122 of the input 108 and the source 120 of the pFET 102 and the other end (e.g., the ground or Vss connection 180) is connected to the source contact 136 of the nFET 106.

The pFET 104 and nFET 106 include gate contacts 140, 142 respectively. These contacts are not shown as connected to any input but reference to FIG. 1 teaches that these contacts can be connected to Vdd in one embodiment. The gate contact 160 of the ESD device 102 is connected to the metalized contact 126 of the pFET 104 and the metalized contact 134 of the nFET.

As above, during normal operations, the inverter (pFET 104 and nFET 106) pulls the gate voltage on the gate contact 160 to low, helping to preserve the ESD device's 102 intrinsic PNPN state and, thus, provide leakage protection In an ESD event (e.g., pad contact 170 experiences an ESD event) the gate contact 160 of the ESD device 102 is now pulled high creating an inversion layer in the lower P-well that effectively converts the PNPN structure to a PN structure. In this manner, the ESD device 102 protects the pFET 104 and nFET 106 in the protection state.

FIGS. 3A and 3B show, respectively, cross-sections taken along lines X-X and Y-Y of FIG. 2. In shall be understood that all "A" figures are taken along line X-X and all "B" figures are taken along line Y-Y in the following discussion. Further, while FIG. 2 is a top view of a completed or partially completed structure, the views shown in FIGS. 3-20 are cross sections of an intermediate structure used to form of final structure.

An initial substrate 200 is provided and used as the substrate to form both an ESD device 102 and a finFET. The initial substrate 200 can be of any suitable substrate material such as, for example, monocrystalline Si, SiGe, SiC, or semiconductor-on-insulator (SOI). In some embodiments, a top layer of the substrate 200 can be Si, SiGe, Group III-V channel material, or other suitable channel materials. Group III-V channel materials include materials having at least one group III element and at least one group V element, such as, for example, one or more of aluminum gallium arsenide, aluminum gallium nitride, aluminum arsenide, aluminum indium arsenide, aluminum nitride, gallium antimonide, gallium aluminum antimonide, gallium arsenide, gallium arsenide antimonide, gallium nitride, indium antimonide, indium arsenide, indium gallium arsenide, indium gallium arsenide phosphide, indium gallium nitride, indium nitride, indium phosphide and alloy combinations including at least one of the foregoing materials.

In the following discussion, a p finFET 104 will be formed but it shall be understood that modifications to fin epitaxy could just as easily from an nFET rather than a pFET. Thus, element 104 will generally be referred to as a finFET. In early figures (e.g., FIGS. 3A, 4A) herein, reference numerals 102, 104 denote general areas. It shall be understood that these general areas will become the completed ESD device 102 and finFET 104 in later figures. Thus, in some instances, the ESD device 102 and the finFET 104 will be referred to as ESD and finFET regions 102, 104 to indicate a particular region of the structure being formed.

As illustrated in FIGS. 3A-B, the substrate is doped in the ESD region 102 to form the first, second and third layers of an ESD device. The first layer 302 is an N (or N+) doped layer and is disposed directly over the substrate 200, the second layer 304 is a P doped layer and is disposed directly over the first layer 302, the third layer 306 is an N doped layer and is disposed directly over the second layer 304. A further layer (fourth layer 1800; FIG. 18B) is provided in the discussion below directly over the third layer 306 and can be a P (or P+) layer to form the final PNPN structure of the ESD device 102. The manner of doping the various layers in FIGS. 3A-B is within the knowledge of the skilled artisan.

FIGS. 4A and 4B show the structure of FIGS. 3A and 3B after fins have been formed in the structure of FIGS. 3A and 3B. As illustrated, both finFET fins 402 and ESD device fins 404 are formed. The fins 404 can be formed such that they extend upwardly from a top of the first layer 302. That is, the fins 404 can be formed such that portions of both the third 306 and second 304 layers are removed. Also, a trench 420 can be formed in the substrate to separate the finFET region 104 from the ESD device region 102. The formation of the trench can occur during the formation of the fins 402/404 or as a separate processing step. The fins 402, 404 and the trench 420 can have a shallow trench isolating material 206 (e.g. an oxide) deposited over and between and a chemical mechanical planarization (CMP) process can be used to expose tops of the fins 402, 404.

FIGS. 5A and 5B show the structure of FIGS. 4A and 4B after one or more fins in the finFET group of fins 402 have been doped to form a punch through prevention implant 502 therein. Such doping can generally be achieved by diffusion and/or by ion implantation. The implants 502 are formed in a region that will underlie the finFET gate (formed later) and divide the fins into sub-fins including a gate sub fin that will be under the gate and other portions that will be instrumental in formation of the drain/source of the finFET. The implants 502 can serve to stop leakage from below them to the gate sub fin region above them.

FIGS. 6A and 6B show the structure of FIGS. 5A and 5B after an oxide recess 604 has been formed to reveal fins that will be part of an ESD device. Such fins are generally reference as ESD fins 404. The formation of the oxide recess 604 can include providing an optically dispersive layer (ODL) 602 over the finFET region 104.

FIGS. 7A and 7B show the structure of FIGS. 6A and 6B after the ODL 602 over there finFET region 104 has been removed.

FIGS. 8A and 8B show the structure of FIGS. 7A and 7B after more of the STI material 206 has been removed to further reveal fins 404 that will be part of the ESD device. The STI material is also removed in to expose portions of the fins 402 that will form the finFET. As illustrated, the process will expose the N layer 306 and at least a portion of the P layer 304. Further, a portion of the STI material 206 remains directly on top of the first layer (N layer 302).

Figure 9B:
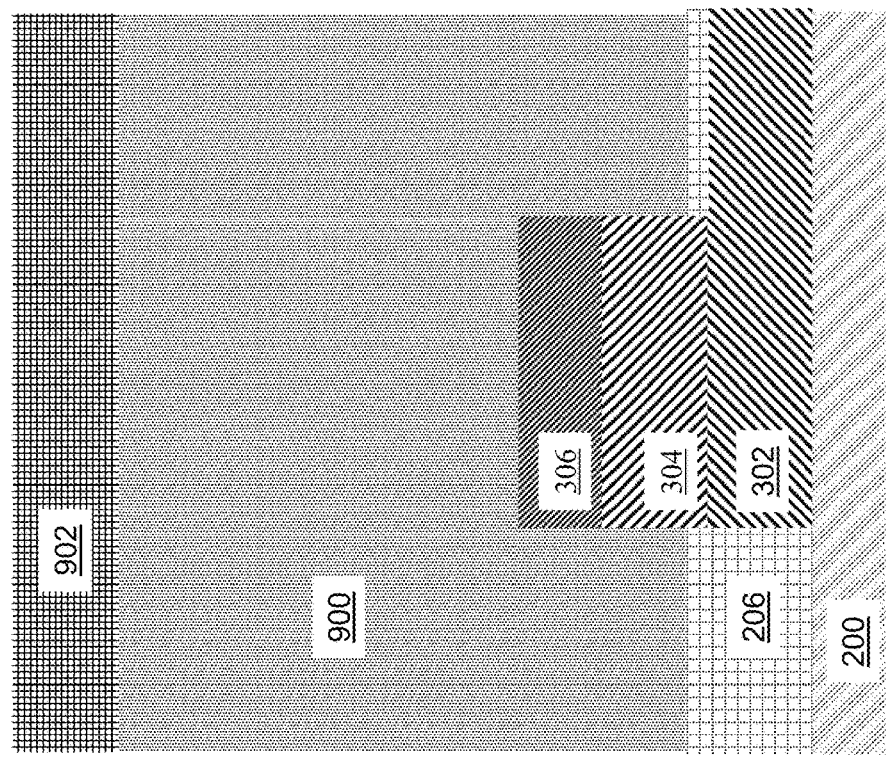
FIGS. 9A and 9B show the structure of FIGS. 8A and 8B after dummy gate material and a hardmask have been deposited over the finFET and the ESD device.
Figure 9A:
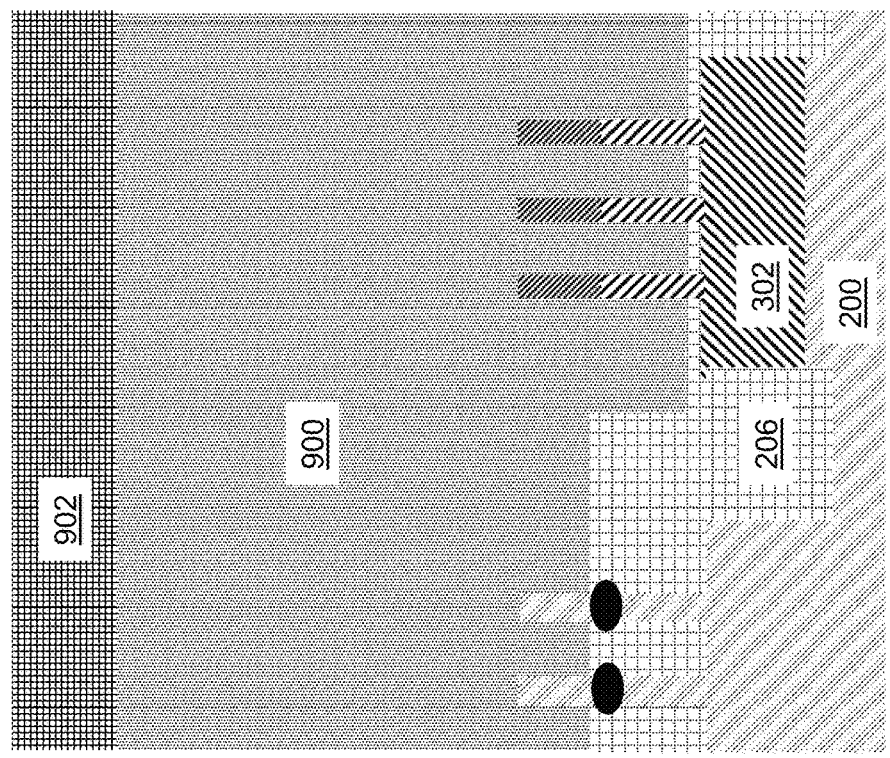

FIGS. 9A and 9B show the structure of FIGS. 8A and 8B after dummy gate material 900 and a hardmask 902 have been deposited over the finFET and the ESD device. The dummy gate material 900 can be a polysilicon in one embodiment.

FIGS. 10A and 10B show the structure of FIGS. 9A and 9B after the dummy gate material 900 has been subjected to a reactive ion etch (RIE) that has removed the dummy gate material between the finFET and the ESD device and spacers have been formed over the remaining dummy gate material 900 with further hardmask material 902. In more detail, the structure of FIGS. 9A and 9B can have the hardmask material 902 patterned to allow for trench 1200 to be formed between the finFET 104 and the ESD device 102. The dummy gate material 900 is removed from the trench 1200 and then some or all of the sides of the dummy gate material 900 can have hardmask 902 deposited thereon. Covering the dummy gate material 900 in this manner allows for drain and source epitaxy for the finFET. Such epitaxy is well known and not discussed further herein.

Figure 11B:
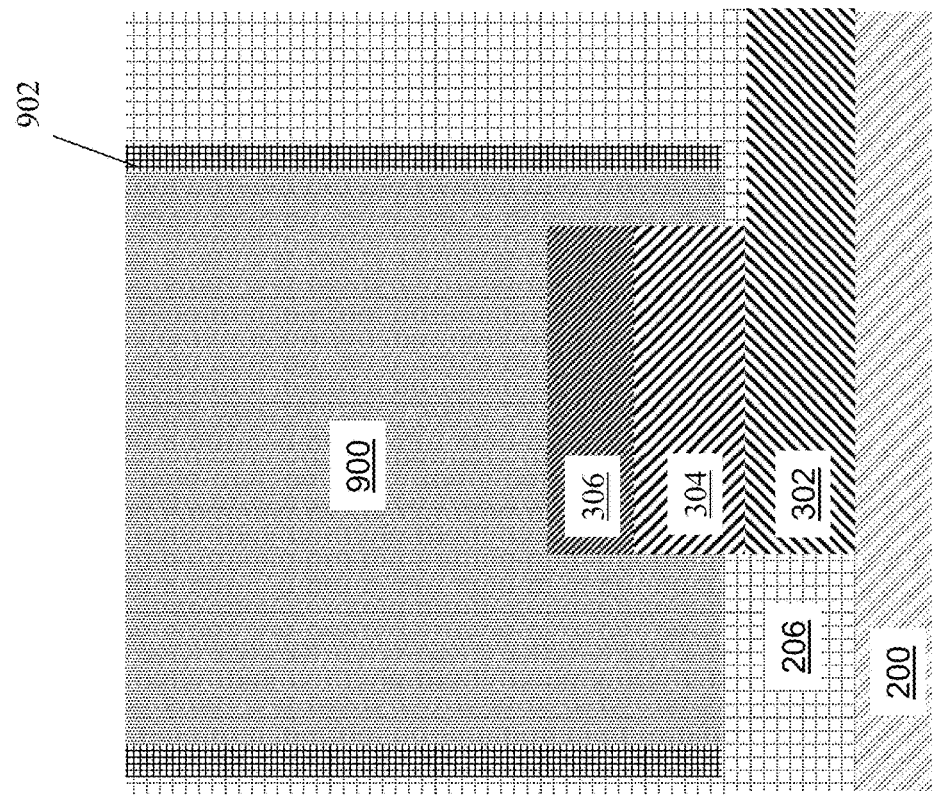
FIGS. 11A and 11B show the structure of FIGS. 10A and 10B after spaces between the dummy gate material has been filled with an oxide (or STI) and access to the remaining dummy gate stack material has been provided by a chemical-mechanical planarization (CMP) process to remove hardmask material that was over the dummy gate stack material.
Figure 11A:
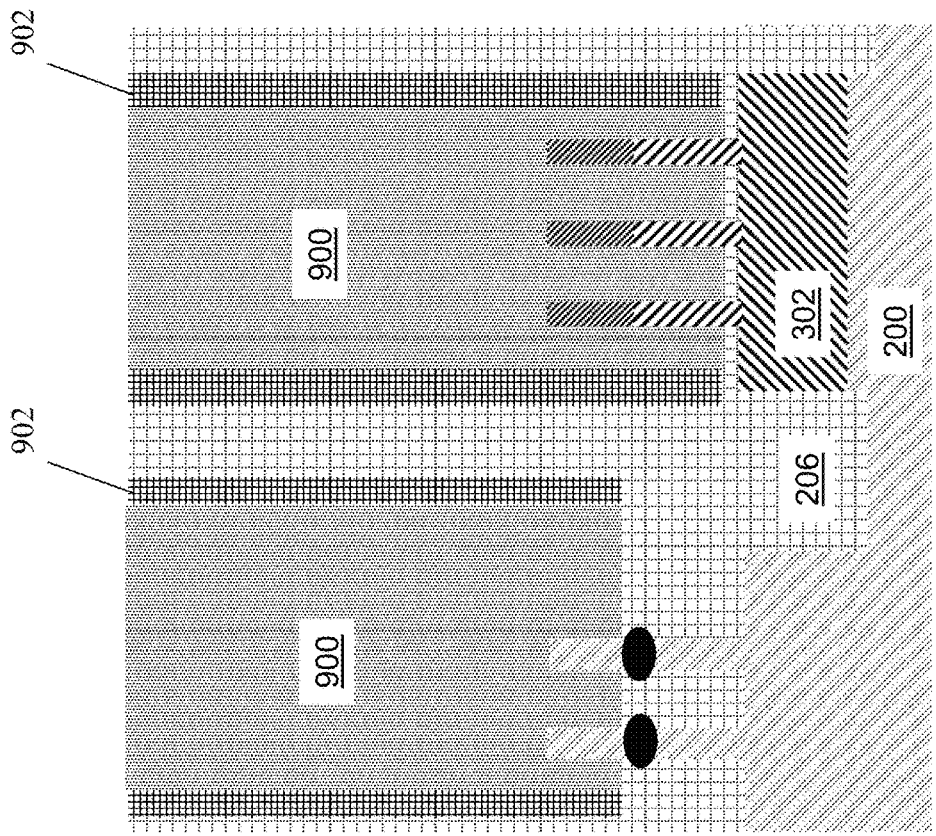

FIGS. 11A and 11B show the structure of FIGS. 10A and 10B after trench 1200 between the dummy gate material 900 has been filled with an oxide (or STI material) 206. and access to the remaining dummy gate stack material 900 has been provided by a chemical-mechanical planarization (CMP) process to remove hardmask material 902 that was over the dummy gate stack material 900. In more detail, the entire structure of FIGS. 10A and 10B can be filled with STI material 206 and then the top of the oxide and the hardmask 902 can be subjected to a CMP process to expose the dummy gate material 900 over the finFET fins 402 and the ESD device fins 404 (best seen in FIGS. 12A and 12B).

FIGS. 12A and 12B show the structure of FIGS. 11A and 11B after removal of the dummy gate material 900. This exposes the finFET fins 402 and the ESD device fins 404. The exposed finFET fins 402 extend into a finFET gate formation region 1202. The gate of the finFET 104 will be formed in this region. At the same time, a gate contact to the ESD device 102 can also be formed in region 1204. In particular, and as shown in FIGS. 13A-13B, a high K dielectric material and a gate metal (collectively shown as element 1302) can be deposited into the finFET gate formation region 1202 and the ESD device gate formation region 1204.

Figure 13B:
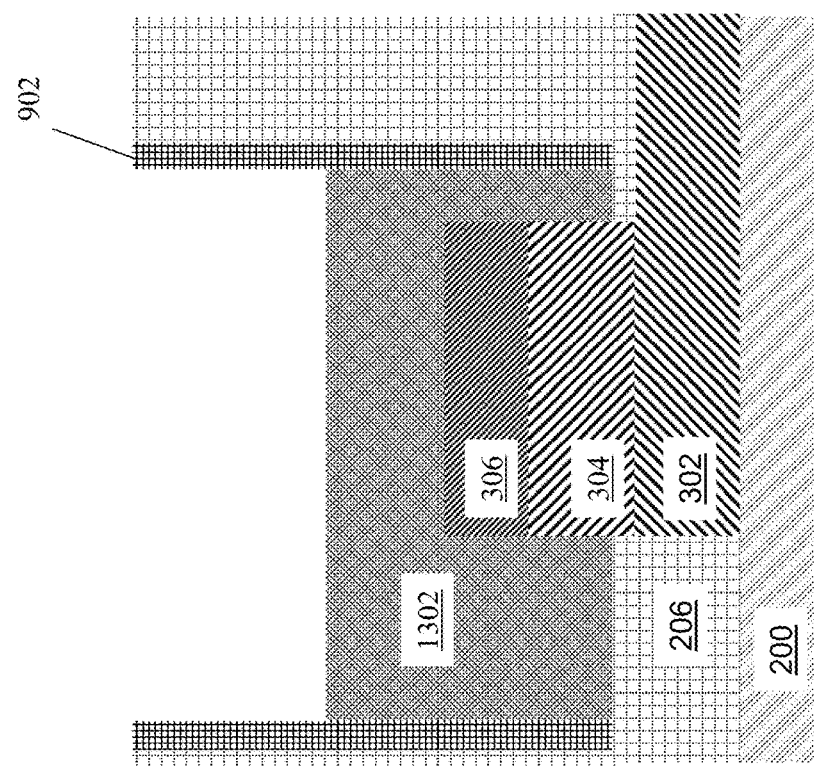
FIGS. 13A and 13B show the structure of FIGS. 12A and 12B after a high k dielectric and a metal gate stack material have been deposited over the fins of the finFET and the ESD device.
Figure 13A:
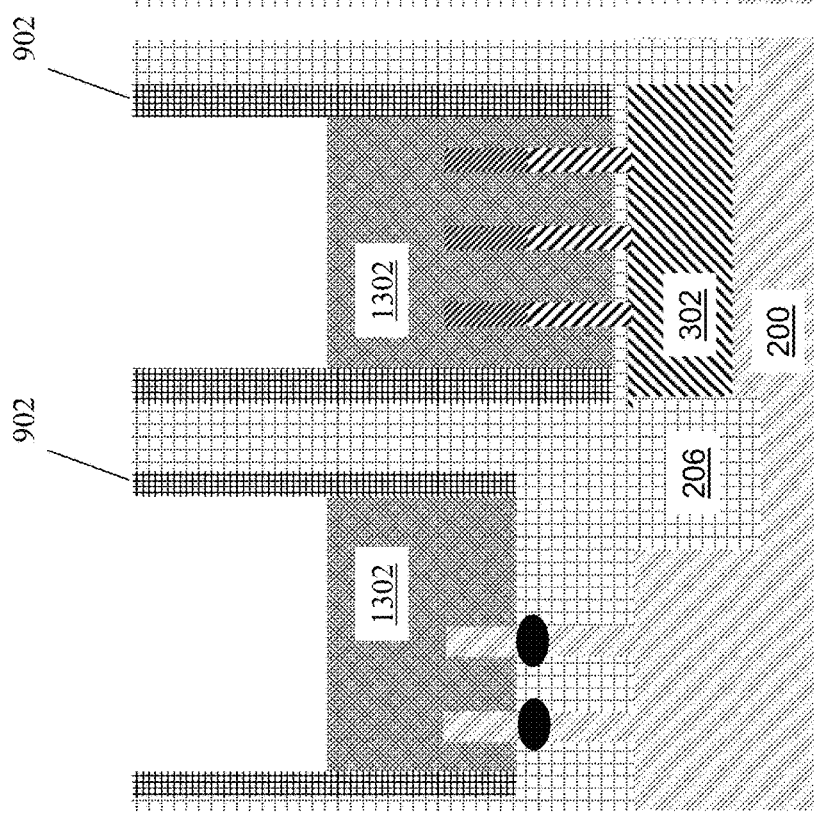
Figure 14B:
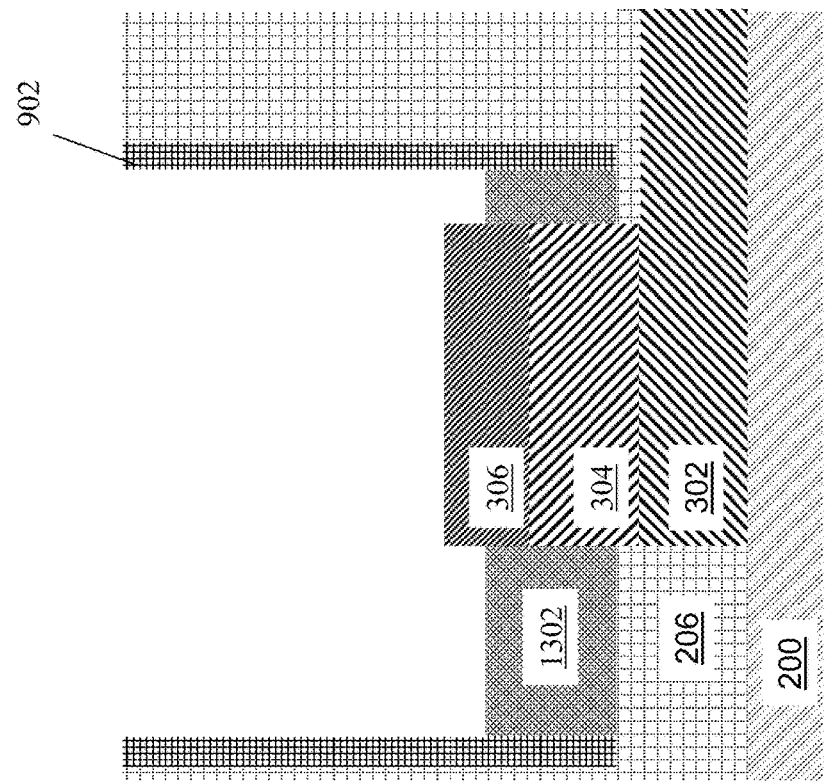
FIGS. 14A and 14B show the structure of FIGS. 13A and 13B after a top over the metal gate stack material in a region surrounding the fins of the ESD device has been lowered to expose the top N layer in the ESD device(e.g., third layer in the PNPN diode stack to form the ESD device)
Figure 14A:
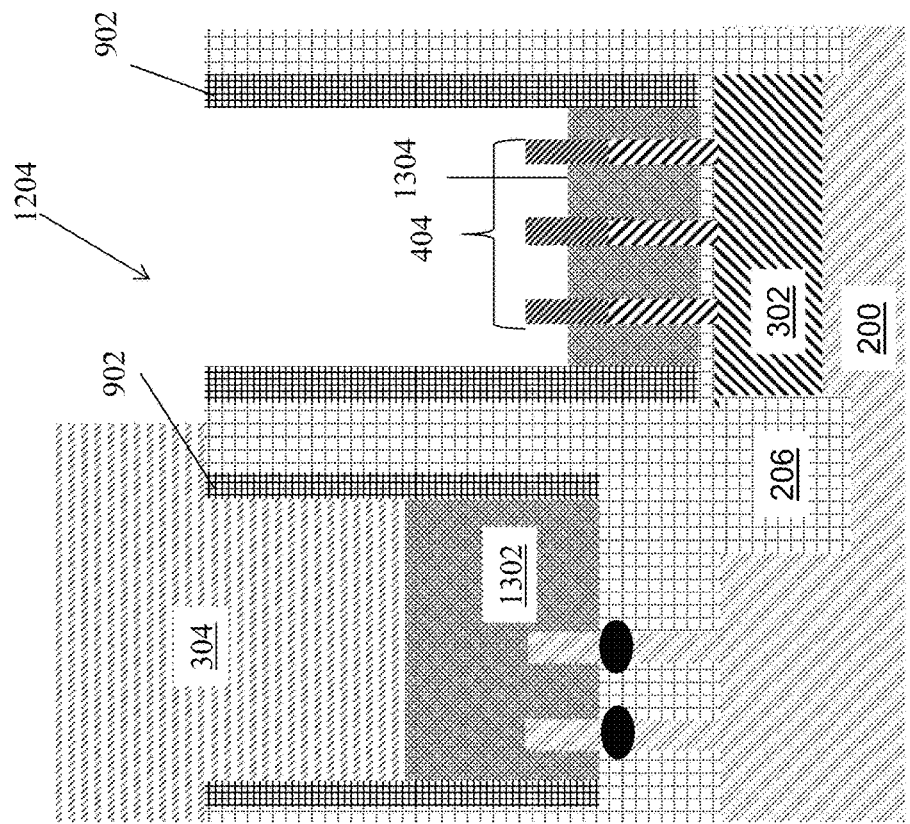

FIGS. 14A and 14B show the structure of FIGS. 13A and 13B after a top 1304 of the metal gate stack material 1302 in a region surrounding the fins of the ESD device 102 (e.g., region 1204) has been lowered to expose the top N layer 306 in the ESD device 102 (e.g., third layer in the PNPN diode stack to form the ESD device). To lower the top of the metal gate stack material 1302 an ODL 304 can be deposited over the metal gate stack material 1302 over the finFET. FIGS. 15A and 15B show the structure of FIGS. 14A and 14B after the metal gate stack material deposited over the fins of the finFET has been exposed by removal of the ODL 304 over the finFET shown in FIGS. 14A-14B.

Figure 16A:
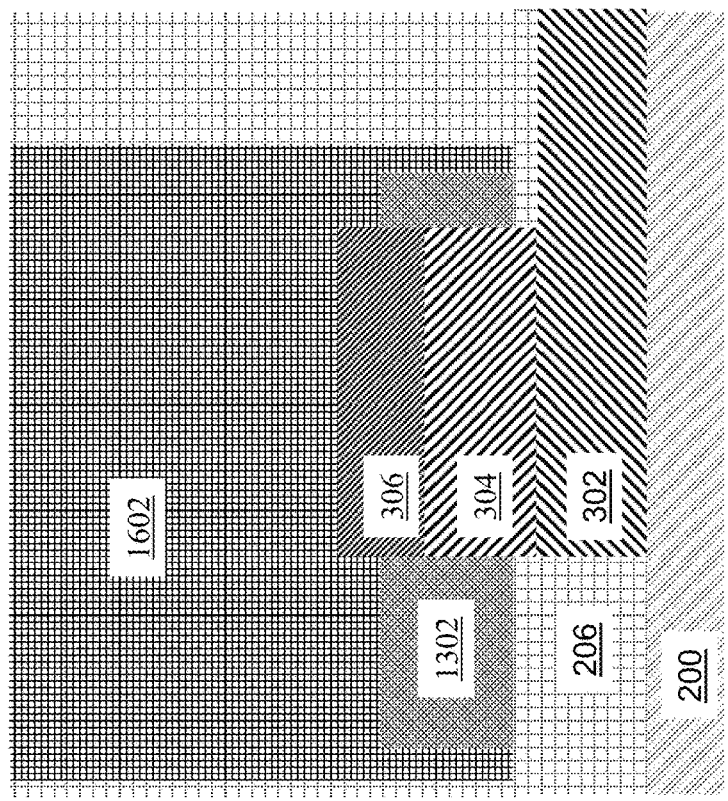
FIGS. 16A and 16B show the structure of FIGS. 15A and 15B after the metal gate stack material deposited over the fins of the finFET and the ESD device has been covered by a hardmask layer.
Figure 16B:
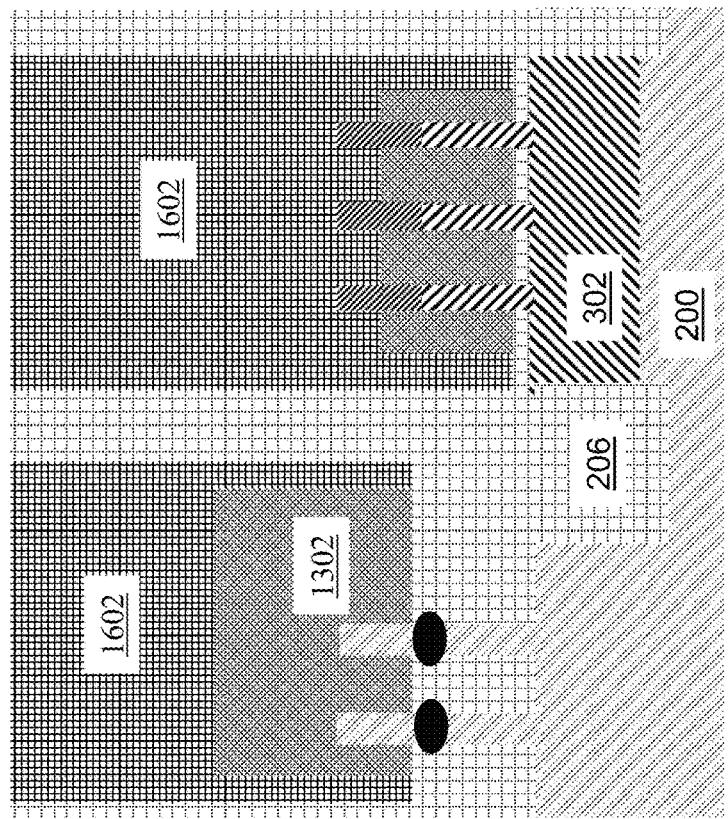

FIGS. 16A and 16B show the structure of FIGS. 15A and 15B after the metal gate stack material 1302 deposited over the fins of the finFET and the ESD device has been covered by a hardmask layer 1602. A CMP process is performed on a top of the metal gate stack material 1302 and the hardmask layer 1602 to polish/level them in one embodiment.

Figure 18A:
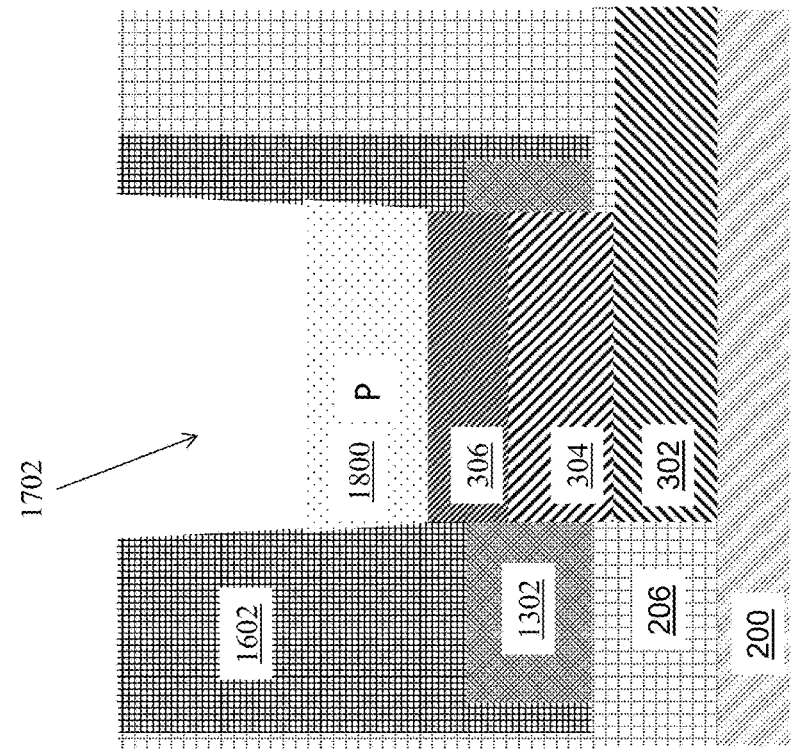
FIGS. 18A and 18B show the structure of FIGS. 17A and 17B deposition of the top P layer (fourth layer) onto the ESD device.
Figure 18B:
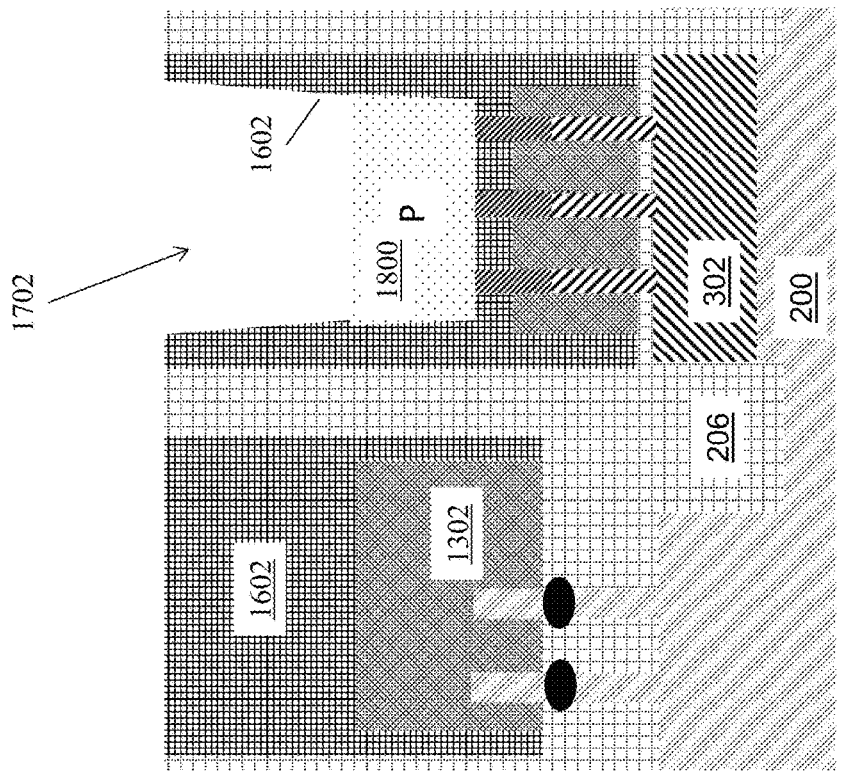

FIGS. 17A and 17B show the structure of FIGS. 16A and 16B after an opening 1702 has been formed over the ESD device 102 to allow for the deposition of the top P layer (fourth layer) onto the ESD device 102 and FIGS. 18A and 18B show the structure of FIGS. 17A and 17B deposition of the top P layer (fourth layer) onto the ESD device 102.

FIGS. 19A and 19B show the structure of FIGS. 18A and 18B after a gate contact well 1902 has been formed over the finFET 104 and a gate contact well 1904 has been formed on a side of the ESD device.

Figure 20B:
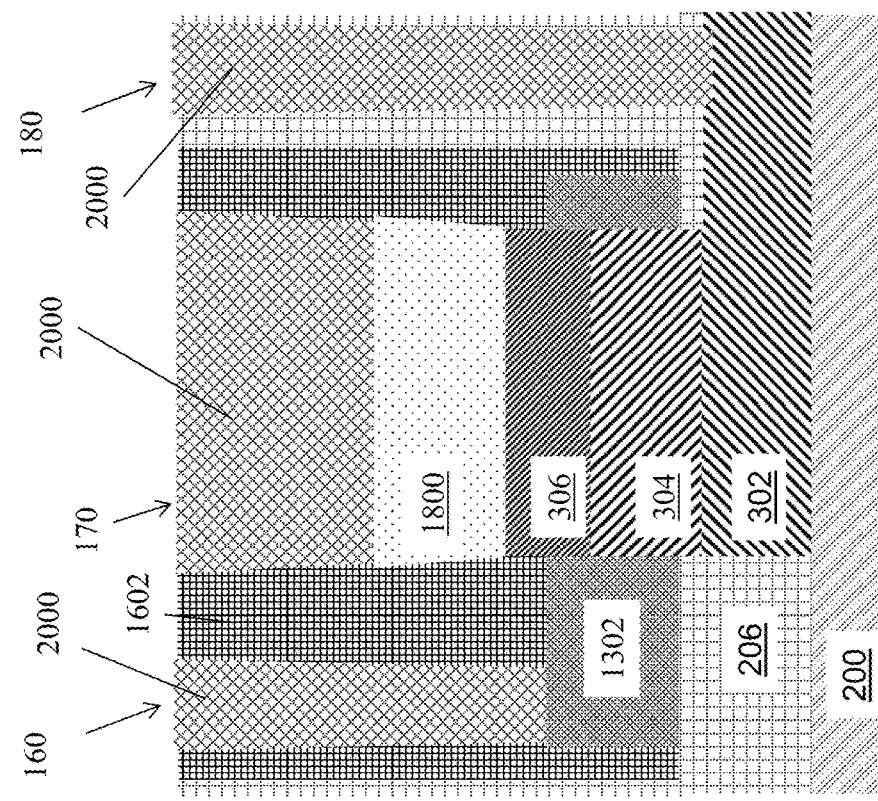
FIGS. 20A and 20B show the structure of FIGS. 19A and 19B after an the gate contacts and the well over the top P layer have been filled with a metal contact material.
Figure 20A:
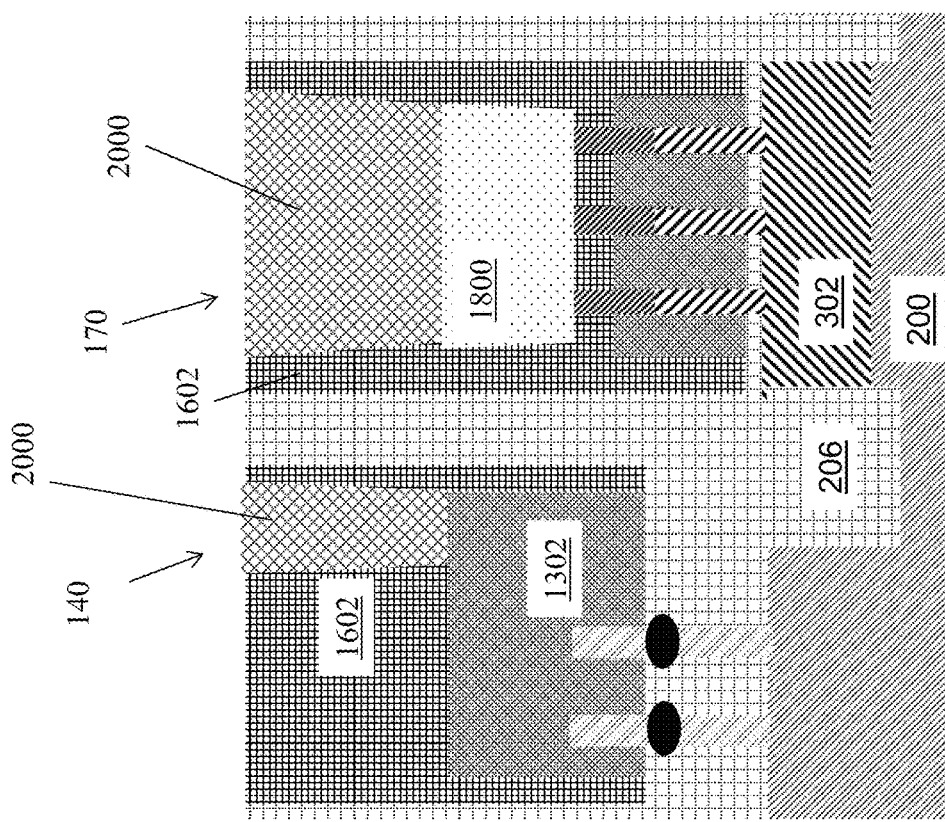

As shown in FIGS. 20A and 20B, the gate contact wells 1902, 1904 and the well 1702 (pad contact) over the top P layer have been filled with a metal contact material 2000. Of course, the structures as shown in FIGS. 20A-20B could be wired together in any fashion and could be connected as shown in FIG. 2, for example.

The gate contact 160 is electrically connected to both the second 304 and third 304 layers. Application of a sufficiently high voltage (e.g., an ESD voltage) will cause those layers to connect the first and third layers 302, 304 forming a PN diode in the manner as describe above to protect any circuit (e.g., finFET 104) connected between the pad contact 170 and the Vss contact 180.

The ground or Vss contact 180 is in direct contact with the first layer 302. The gate contact 160 is on a first side of the ESD device 102 and the Vss contact 180 is on an opposite side of the ESD device 102 as shown in FIGS. 2 and 20B.

As illustrated, the pad contact 170 is physically disposed between the gate contact 160 is on a first side of the ESD device 102 and the Vss contact.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor device including an electrostatic discharge (ESD) device formed adjacent to a first fin field effect transistor (finFET), the device comprising:
    a substrate;
    the first finFET, the first finFET being formed such that it includes finFET fins extending from the substrate; and
    the ESD device, the ESD device being adjacent to the first finFET and including two vertically stacked PN diodes including vertically stacked first, second, third and fourth layers, wherein the first layer is an N doped layer and is disposed directly over the substrate, the second layer is a P doped layer and is disposed directly over the first layer, the third layer is an N doped layer and is disposed directly over the second layer and the fourth layer is a P doped layer and is disposed directly over the third layer.

2. The semiconductor device of claim 1, wherein the ESD device includes a gate contact in electrical contact with the second and third layers.

3. The semiconductor device of claim 2, wherein the second and third layers are doped such that when an ESD voltage is applied to the gate contact, the second layer has an inversion layer formed therein that couples the first and third layers together to convert the ESD device into an NP diode.

4. The semiconductor device of claim 2, wherein the gate contact is on a first side of the ESD device and further comprising:
    a ground contact contacting the first layer and disposed on a second side of the ESD that is opposite the first side.

5. The semiconductor device of claim 2, wherein the ESD device further includes an ESD gate contact in electrical contact with the fourth layer.

6. The semiconductor device of claim 5, wherein the first finFET includes a first finFET source and a first finFET drain and wherein one of the first finFET source and the first finFET drain is connected to the ESD gate contact.

7. The semiconductor device of claim 2, further comprising:
    a second finFET device formed adjacent to the first finFET device.

8. The semiconductor device of claim 7, wherein the first finFET includes a first finFET source and a first finFET drain and the second finFET device includes a second finFET source and second finFET drain;
    wherein first finFET drain is directly connected to the second finFET drain.

9. A semiconductor device formed on a substrate, the device comprising:
    a p-channel fin field effect transistor (p-finFET) having a p-finFET drain and a p-finFET source and formed on a substrate;
    an n-channel fin field effect transistor (n-finFET) adjacent the p-finFET and having a n-finFET drain and a p-finFET source,
    wherein the p-finFET source is connected to an input line, the p-finFET drain is connected to the n-finFET drain; and
    an electrostatic discharge (ESD) device, the ESD device disposed adjacent the p-finFET and including two vertically stacked PN diodes including vertically stacked first, second, third and fourth layers, wherein the first layer is an N doped layer and is disposed directly over the substrate, the second layer is a P doped layer and is disposed directly over the first layer, the third layer is an N doped layer and is disposed directly over the second layer and the fourth layer is a P doped layer and is disposed directly over the third layer.

10. The semiconductor device of claim 9, wherein the ESD device includes a gate contact in electrical contact with the second and third layers.

11. The semiconductor device of claim 10, wherein the second and third layers are doped such that when an ESD voltage is applied to the gate contact, the second layer has an inversion layer formed therein that couples the first and third layers together to convert the ESD device into a PN diode.

12. The semiconductor device of claim 10, wherein the gate contact is on a first side of the ESD device and further comprising:
    an ESD ground contact contacting the first layer and disposed on a second side of the ESD that is opposite the first side, the ESD ground contact being electrically connected to the n-finFET source.

13. The semiconductor device of claim 10, wherein the ESD device further includes an ESD pad contact in electrical contact with the fourth layer.

14. The semiconductor device of claim 13, wherein the ESD pad contact is directly connected to the p-finFET source.

15. The semiconductor device of claim 14, wherein:
    the p-finFET includes a p-finFET gate;
    the n-finFET includes a n-finFET gate electrically connected to the p-finFET gate.

16. A method for forming a semiconductor device including a fin field effect (finFET) transistor, the method comprising:
    receiving a substrate;
    doping an electrostatic discharge (ESD) device portion of the substrate to include a first layer directly on the substrate and that is n-doped, a second layer directly on the first layer and that is p-doped and a third layer directly on the second layer that is n-doped;
    forming a plurality of fins including a p-finFET group of fins formed from the substrate and an ESD group of fins formed to include the portions of the second and third layers;
    filling space between the fins with a shallow trench isolator (STI);
    removing a portion of the STI to expose the p-finFET group and the second and third layers of the ESD device group;
    depositing a metal gate stack material over the p-finFET group and ESD group;
    exposing portions for fins in the ESD group above a top of the metal gate stack material;

forming a nitride cap of the ESD group and over metal gate stack material that is over the p-finFET group;
forming a fourth layer over the third layer; and
forming an ESD gate contact, a p-finFET gate contact and a ground contact in the nitride cap.

17. The method of claim 16, further comprising:
doping one or more fins in the p-finFET group of fins to form a punch through prevention implant.

18. The method of claim 16, wherein the STI is removed to a lower level over the ESD device group of than the over the p-finFET group of fins.

19. The method of claim 16, wherein a high-k dielectric is disposed directly over the p-finFET group and ESD group before the metal gate stack is deposited.

20. The method of claim 16, further comprising:
forming an opening in the nitride cap over the ESD group before forming the fourth layer.

21. A method for forming a semiconductor device including a fin field effect (finFET) transistor and a protection device, the method comprising:
receiving a substrate;
doping an electrostatic discharge (ESD) device portion of the substrate to include a first layer directly on the substrate and that is n-doped, a second layer directly on the first layer and that is p-doped and a third layer directly on the second layer that is n-doped;
forming a plurality of fins including a p-finFET group of fins formed from the substrate and an ESD group of fins formed to include the portions of the second and third layers;
filling space between the fins with a shallow trench isolator (STI);
removing a portion of the STI to expose the p-finFET group and the second and third layers of the ESD device group;
depositing a metal gate stack material over the p-finFET group and ESD group;
exposing portions for fins in the ESD group above a top of the metal gate stack material;
forming a nitride cap of the ESD group and over metal gate stack material that is over the p-finFET group;
forming a fourth layer over the third layer;
forming an ESD gate contact, a p-finFET gate contact and a ground contact in the nitride cap;
forming a drain contact that contacts fins in the p-finFET group on one side of the metal gate stack material; and
connecting the drain contact to the ESD gate contact.

22. The method of claim 21, further comprising forming a source contact that contacts fins in the p-finFET group on another side of the metal gate stack material.

23. The method of claim 21, wherein the STI is removed to a lower level over the ESD device group of than the over the p-finFET group of fins.

24. The method of claim 21, further comprising:
forming an opening in the nitride cap over the ESD group before forming the fourth layer.

25. The method of claim 21, wherein the fourth layer is a p-doped layer.

* * * * *